United States Patent
Mercado

(10) Patent No.: US 7,148,953 B2
(45) Date of Patent: Dec. 12, 2006

(54) APOCHROMATIC UNIT-MAGNIFICATION PROJECTION OPTICAL SYSTEM

(75) Inventor: Romeo I. Mercado, Fremont, CA (US)

(73) Assignee: Ultratech, Inc., San Jose, CA (US)

( * ) Notice: Subject to any disclaimer, the term of this patent is extended or adjusted under 35 U.S.C. 154(b) by 136 days.

(21) Appl. No.: 10/980,110

(22) Filed: Nov. 1, 2004

(65) Prior Publication Data
US 2006/0092395 A1    May 4, 2006

(51) Int. Cl.
    *G03B 27/42* (2006.01)
(52) U.S. Cl. ............... 355/53; 355/67; 355/71
(58) Field of Classification Search ............... None
    See application file for complete search history.

(56) References Cited

U.S. PATENT DOCUMENTS

| | | | |
|---|---|---|---|
| 4,103,989 A | 8/1978 | Rosin | 350/199 |
| 4,171,870 A | 10/1979 | Bruning et al. | 350/173 |
| 4,171,871 A | 10/1979 | Dill et al. | 350/199 |
| 4,391,494 A | 7/1983 | Hershel | 350/442 |
| 4,425,037 A | 1/1984 | Hershel et al. | 355/43 |
| 4,469,414 A | 9/1984 | Shafer | 350/444 |
| 4,681,407 A | 7/1987 | Mercado | 350/471 |
| 4,704,011 A | 11/1987 | Mercado | 350/467 |
| 4,768,869 A | 9/1988 | Mercado | 350/505 |
| 4,929,071 A | 5/1990 | Mercado | 350/463 |
| 4,934,801 A | 6/1990 | Mercado | 350/572 |
| 4,964,705 A | 10/1990 | Markle | 350/442 |
| 5,000,548 A | 3/1991 | Mercado | 354/414 |
| 5,031,977 A | 7/1991 | Gibson | 350/1.4 |
| 5,040,882 A | 8/1991 | Markle | 359/727 |
| 5,161,062 A | 11/1992 | Shafer et al. | 359/785 |
| 5,559,629 A | 9/1996 | Sheets et al. | 359/364 |
| 5,805,356 A | 9/1998 | Chiba | 359/727 |
| 6,809,888 B1 * | 10/2004 | Markle | 359/726 |
| 6,813,098 B1 * | 11/2004 | Mercado | 359/727 |
| 6,863,403 B1 * | 3/2005 | Mercado et al. | 353/97 |

OTHER PUBLICATIONS

R. I. Mercado, "The design of apochromatic optical systems," International Lens Design Conference, SPIE vol. 554, pp. 217-227, 1985.
R. I. Mercado, L Ryzhikov, "Designs of apochromats and superachromatic objectives," SPIE vol. 3482, pp. 321-331.
R. I. Mercado, "Design of apochromats and superachromats," Critical Reviews vol. CR41, Lens Design, pp. 270-296.

* cited by examiner

*Primary Examiner*—D. Rutledge
(74) *Attorney, Agent, or Firm*—Allston L. Jones

(57) ABSTRACT

A projection optical system suitable for projection photolithography is disclosed. The projection optical system is a modified Wynne-Dyson system capable of imaging a large field over both a narrow and a broad spectral range. The projection optical system includes a positive lens group arranged adjacent to but spaced apart from a concave mirror along the mirror axis on the concave side of the mirror. The system also includes a variable aperture stop so that the system has a variable NA. The projection optical system has two or more common foci within an ultraviolet exposure band and a third common focus in a visible alignment band. A projection photolithography system that employs the projection optical system is also disclosed.

67 Claims, 16 Drawing Sheets

APOCHROMATIC UNIT-MAGNIFICATION PROJECTION OPTICAL SYSTEM

CROSS-REFERENCE TO RELATED APPLICATIONS

The present invention is related to U.S. patent application Ser. No. 10/336,066, entitled "Variable Numerical Aperture Large-field Unit-magnification Projection System," filed on Jan. 2, 2003 and to U.S. patent application Ser. No. 10/330,567, entitled "Large Field Unit Magnification Projection System," filed on Dec. 27, 2002, each of which is assigned to the present Assignee Ultratech, Inc. of San Jose, Calif.

BACKGROUND OF THE INVENTION

1. Field of the Invention

The present invention relates to projection optical systems, and in particular to apochromatic large-field unit-magnification projection optical systems for photolithographic applications.

2. Description of the Prior Art

Photolithography is presently employed not only in sub-micron resolution integrated circuit (IC) manufacturing, but also to an increasing degree in advanced wafer-level IC packaging as well as in semiconductor, microelectromechanical systems (MEMS), nanotechnology (i.e., forming nanoscale structures and devices), and other applications. These applications require multiple imaging capabilities ranging from relatively low resolution (i.e., a few microns) with large depth of focus, to relatively high resolution (i.e. sub-micron) and a high throughput.

The present invention, as described in the Detailed Description of the Invention section below, is related to and is an improvement over the projection optical system described in U.S. Pat. No. 4,391,494 (hereinafter, "the '494 patent") issued on Jul. 5, 1983 to Ronald S. Hershel and assigned to General Signal Corporation, which patent is hereby incorporated by reference.

FIG. 1 is a cross-sectional diagram of an example prior art projection optical system 8 according to the '494 patent. The projection optical system described in the '494 patent and illustrated in FIG. 1 is a unit-magnification, catadioptric, achromatic and anastigmatic, projection optical system that uses both reflective and refractive elements in a complementary fashion to achieve large field sizes and high numerical apertures (NAs). The system is basically symmetrical relative to an aperture stop located at the mirror, thus eliminating odd order aberrations such as coma, distortion and lateral color. All of the spherical surfaces are nearly concentric, with the centers of curvature located close to where the focal plane would be located were the system not folded. Thus, the resultant system is essentially independent of the index of refraction of the air in the lens, making pressure compensation unnecessary.

Optical system 8 includes a concave spherical mirror 10, an aperture stop AS1 located at the mirror, and a composite, achromatic plano-convex doublet lens-prism assembly 12. Mirror 10 and assembly 12 are disposed symmetrically about an optical axis 14. Optical system 8 is essentially symmetrical relative to an aperture stop AS1 located at mirror 10 so that the system is initially corrected for coma, distortion, and lateral color. All of the spherical surfaces in optical system 8 are nearly concentric.

In optical system 8, doublet-prism assembly 12 includes a meniscus lens 13A, a plano-convex lens 13B and symmetric fold prisms 15A and 15B. In conjunction with mirror 10, assembly 12 corrects the remaining optical aberrations, which include axial color, astigmatism, petzval, and spherical aberration. Symmetric fold prisms 15A and 15B are used to attain sufficient working space for movement of a reticle 16 and a wafer 18.

Optical system 8 also includes an object plane OP1 and an image plane IP1, which are separated via folding prisms 15A and 15B. The cost of this gain in working space is the reduction of available field size to about 25% to 35% of the total potential field. In the past, this reduction in field size has not been critical since it has been possible to obtain both acceptable field size and the degree of resolution required for the state-of-the-art circuits.

In the '494 patent, the doublet-prism assembly corrects the remaining optical aberrations, which include axial color in the g-h band, astigmatism, petzval, and spherical aberration. However, the '494 patent cannot provide a very high quality image for large-field and broad spectral band applications ($\geq 50$ mm×100 mm and g, h and I spectral lines), and numerical apertures of $0.15 \leq NA \geq 0.20$. Moreover, the teaching of the '494 patent also does not provide for a unit-magnification projection optical system with high quality imagery for numerical apertures of $0.2 \leq NA \leq 0.40$ with a field radius greater than 38 mm for a broad exposure band. The '494 patent also does not provide for achromatization at this broad exposure band and at a visible wavelength, which is desirable for aligning the mask and the wafer in a photolithography system.

The present invention, as described in the Detailed Description of the Invention section below, is also related to and in an improvement over the projection optical system described in U.S. Pat. No. 4,171,871 (hereinafter, "the '871 patent"), issued on Oct. 23, 1979 to Dill et al., and assigned to IBM Corporation, which patent is hereby incorporated by reference.

The projection optical system of the '871 patent is achromatic over a wide spectral band and utilizes a total of five glass types for the lens elements with dioptric powers. The projection optical system of the '871 patent is comprised of three glass types for the first lens group, two glass types for the second lens group, and a mirror. The combination of the second lens group and the mirror constitute what is known in the art of optical design as a "Mangin mirror". The projection optical system of the '871 patent may be aligned in the green part of the visible spectrum if the exposure system operates at a near UV wavelength without refocusing since the projection system provides two coincident foci over this broad spectral band. This may be contrasted with the present invention, described below, which provides achromatization at two or more discrete wavelengths within the broad ultraviolet (UV) exposure spectral band covering the g, h, and I lines of the mercury spectrum, as well as achromatization simultaneously at another additional discrete visible wavelength where the photoresist is not sensitive.

To address the present-day robust requirements of a photolithography system as discussed above, it is desirable to have a projection optical system capable of providing a large-field, with relatively low-resolution imaging, as well as a system providing a moderate size field, with relatively high-resolution imaging. It is preferable that such a projection optical system provide exposure with diffraction-limited performance over a broad exposure wavelength band covering the g, h, and I spectral lines of mercury (436 nm, 405 nm, 365 nm, respectively) for high-throughput with applications requiring high exposure doses.

SUMMARY OF THE INVENTION

The present invention includes unit-magnification projection optical systems for photolithography that are not only achromatic over the g, h, and I spectral band, but also apochromatic or superachromatic across this band and an extended band that also includes a wavelength in the visible region. Apochromatic means color-corrected at three wavelengths in the spectral band pass and superachromatic means color-corrected at four or more wavelengths.

The present invention includes Wynne-Dyson-based projection optical systems that are color-corrected at least at two wavelengths in the ultraviolet ("UV") exposure spectral band (hereinafter, the "exposure band") that includes the g, h and I wavelengths, and is color corrected over an alignment spectral band (hereinafter, the "alignment band") that includes at least one visible wavelength. The occurrence of common foci in the alignment and exposure bands implies that no refocusing is required for the visible wavelength used to align the mask and the wafer through the projection system.

Another feature of the invention is to provide diffraction-limited Wynne-Dyson type projection optical systems for broad-band lithography application that are not only apochromatic or superachromatic, but also well corrected for chromatic variations of both aperture-dependent and field-dependent aberrations. The invention also provides both low and moderately high NA systems with optical parameters scalable over a wide range of apertures and field radii, while preserving diffraction-limited performance over the relatively wide exposure band.

Accordingly, a first aspect of the invention is a projection optical system comprising along an optical axis, a concave spherical mirror and an aperture stop located at the mirror and centered on the optical axis that determines a numerical aperture (NA) of the system. The system also includes a positive lens group with positive refracting power arranged adjacent the mirror and spaced apart therefrom.

In different embodiments, the positive lens group includes in order towards the mirror, either a) a positive lens and a negative lens; b) a plano-convex lens, a negative meniscus lens and a positive meniscus lens; or c) a plano-convex lens, and first and second negative meniscus lenses.

The system also has first and second prisms each having respective first and second flat surfaces, wherein the second flat surfaces are arranged adjacent the positive lens on opposite sides of the optical axis, and wherein the first flat surfaces are arranged adjacent object and image planes, respectively. The projection optical system has unit magnification and has two or more common foci at respective ultraviolet wavelengths and another common focus at a visible wavelength.

A second aspect of the invention is a photolithography system that includes the projection optical system of the present invention.

Figure 1:
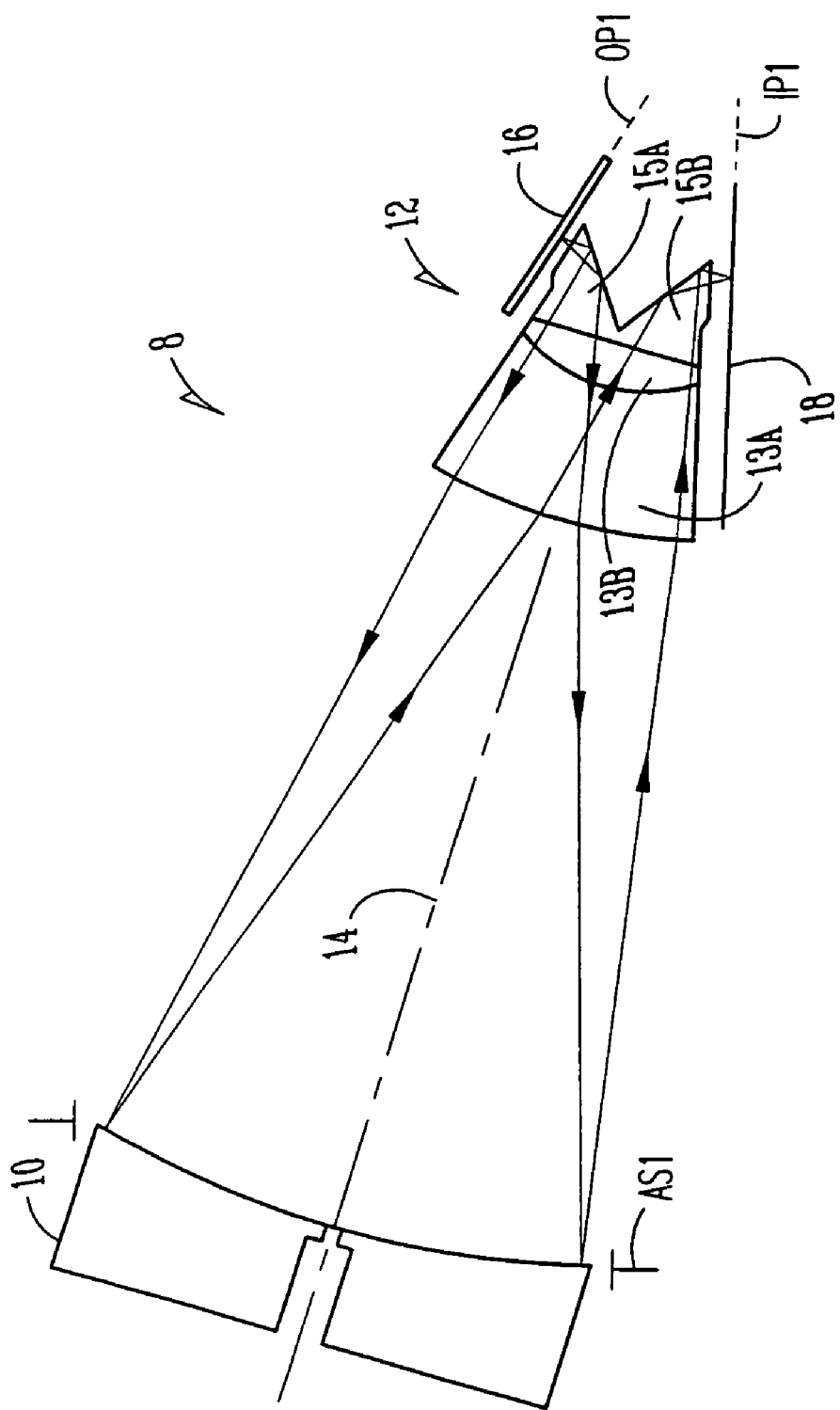
FIG. 1 is a cross-sectional diagram of an example prior art unit-magnification projection optical system according to the '494 patent.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

The present invention is a large-field, broad spectral band color-corrected, anastigmatic, projection optical system capable of projecting an image of a pattern formed on a reticle onto a substrate (wafer) at substantially unit magnification. The unit-magnification projection optical system of the present invention is an improvement over the prior art optical systems of the '871 patent and '494 patent, an embodiment of the latter being described briefly above in the "Description of the Prior Art" section, and illustrated in FIG. 1.

As used herein, the term "exposure field" means a field size that a photolithography system is capable of imaging when it is used in a step-and-repeat mode of operation. Also, the term "color corrected" means having a common (coincident) focus position for different wavelengths of light.

General Design Considerations

The present invention provides designs of unit-magnification projection optical systems that are not only achromatic over the exposure band, but also apochromatic or superachromatic across this exposure band and at an extended band that also includes the visible alignment band.

The occurrence of common foci in the exposure and alignment bands enables the mask and the wafer in a photolithography system to be aligned without the need for refocusing. The present invention also provides apochromatic and superachromatic designs for both low and moderately high NA systems with optical parameters scalable over a wide range of apertures and field radii.

This is achieved while preserving diffraction-limited performance over the exposure band. The broad-band color correction is accomplished by proper choices of the optical materials and the power distribution of the dioptric lens elements. The correction of the aperture-dependent aberrations and field-dependent aberrations, as well as the chromatic variations, is achieved by choosing an appropriate set of optical parameters to optimize the diffraction-limited performance of the projection optical system.

The projection optical system of the present invention as described in detail below has very good image quality (e.g., polychromatic Strehl ratios greater than 0.96) over a large field, and the broad exposure band.

A major obstacle for designing a broad-spectral-band projection lens system is the chromatic variation of aberrations over the wide wavelength spectrum for both the aperture-dependent and field-dependent aberrations. Aperture-dependent aberrations include spherical aberration, spherochromatism, and axial chromatic aberrations. The field-dependent aberrations include coma, astigmatism, Petzval or field curvature, distortion, and lateral color.

For a Wynne-Dyson type optical system, axial chromatic aberrations, spherochromatism (chromatic variation of spherical aberration), astigmatism, and the chromatic variations of astigmatism and field curvature are the main aberrations to be corrected or minimized for systems intended for broad-band applications. Since the Wynne-Dyson type optical system is holosymmetric relative to the aperture stop located at the mirror element, coma, distortion, and lateral color are well corrected.

In the '494 patent and '871 patent, the optical glasses in the lens elements were chosen by the inventors to achromatize the projection optical system over the spectral band pass of the intended application. In the case of the '494 patent, the achromatization is in the g-h exposure band, and for the '871 patent the achromatization is essentially in the I-line exposure wavelength and the 500 nm alignment wavelength.

In the '871 patent, a compound Mangin mirror was used presumably to correct the spherical aberration of the mirror as well as to complement the first group of lenses for achromatization. The design embodiments of the '494 and '871 patents have color correction at two wavelengths. The method of selecting lens materials for color correction at two discrete wavelengths is well known in the optics literature. Two-wavelength color correction is normally achieved by choosing glasses having different Abbe numbers among glass types with high internal transmission in the spectral band of application. The remaining aberrations of the system are corrected or reduced by suitable selection of the lens radii and thicknesses and mirror radius to achieve diffraction-limited performance.

In the design embodiments of the present invention as set forth accompanying in Tables 1–7, broad-band color correction was achieved by suitable choices of lens materials such that the partial dispersion ratios over the exposure band and the alignment band are essentially equal or very close in value. Despite several known methods of selecting optical materials for achromatization and correction of secondary spectrum in lens designs, this approach was used because there are only a limited number of glasses with very high internal transmittance in the g, h, and I lines that are commercially available and suitable for photolithography lenses. The dioptric power distribution of these lens elements and mirror were chosen to establish the initial optical system design configuration having broad band axial chromatic aberration correction and Petzval correction, while also satisfying the basic system requirements (e.g., NA, field size, lens system length, working distances, etc.).

The constructional optical parameters (I. e., radii of curvatures, lens thicknesses, air-spaces, surface configuration) were selected using computer-aided design to optimally correct both the aperture-dependent aberrations and the field-dependent aberrations, as well as their chromatic variations to the extent that the projection optical system becomes diffraction-limited over the exposure band (g, h and I lines) and color-corrected at the alignment band (normally in the green to the red region of the visible spectrum).

For the example embodiments with NAs higher than 0.20, the mirror was designed to be aspherical in order to correct the spherical aberration and the lens parameters simultaneously adjusted for reduction of spherochromatism. For the large-field low-NA systems, such as the example embodiments set forth in Tables 5 and 6, the convex surface of lens element L3 was made aspherical to complement the correction of astigmatism and its chromatic variations.

For applications requiring NA≧0.2, the mirror in Tables 5 and 6 may also be aspherized in order to improve the correction of the aperture-dependent aberrations complementing the aspherical convex surface of L3 in the correction of the astigmatism and its chromatic variations to further optimize the overall optical system performance at the large field.

General Optical System Configuration

Figure 2:
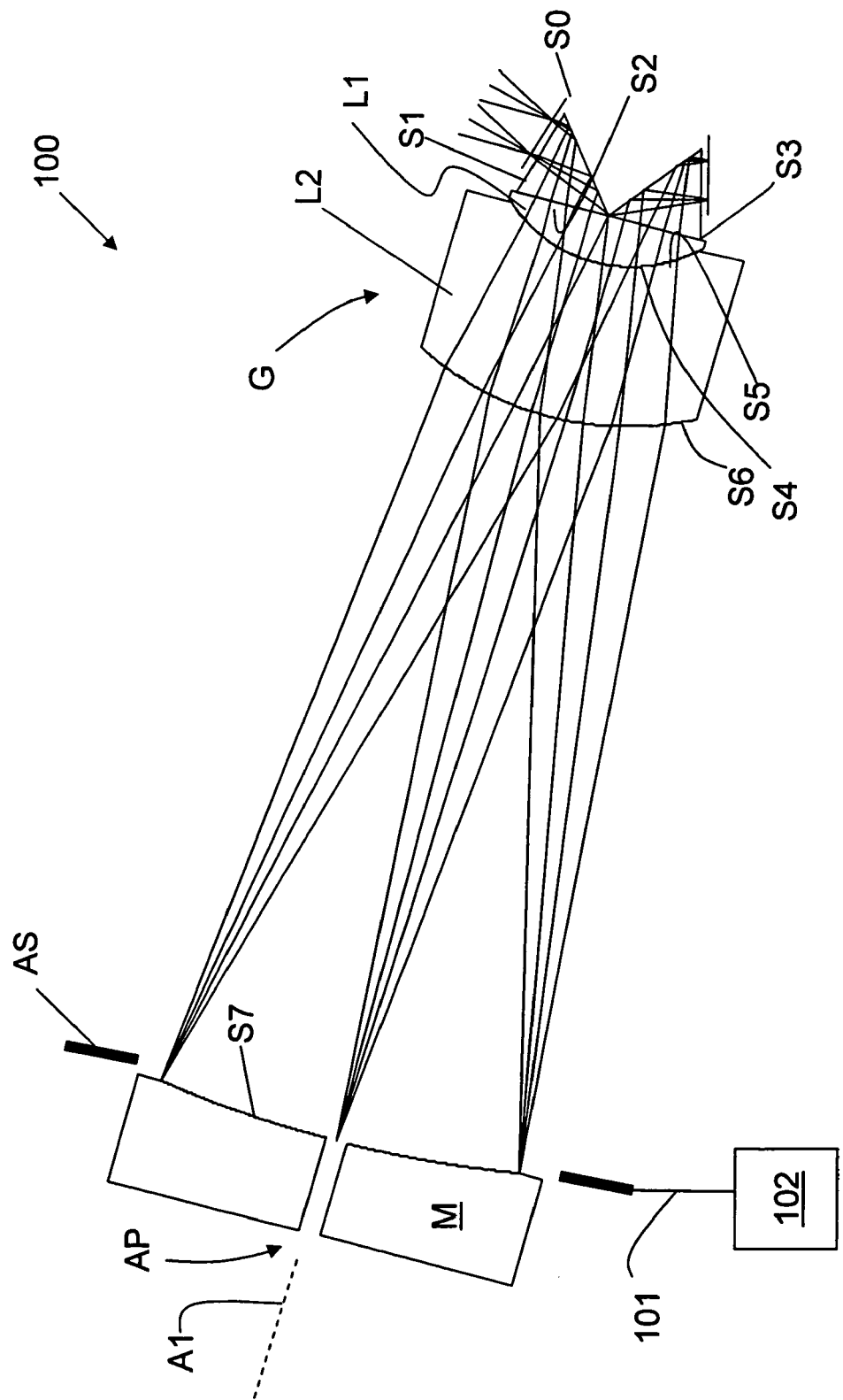
FIG. 2 is cross-sectional diagram of a first example embodiment of the unit-magnification projection optical system of the present invention having a two-element main lens group.
Figure 3:
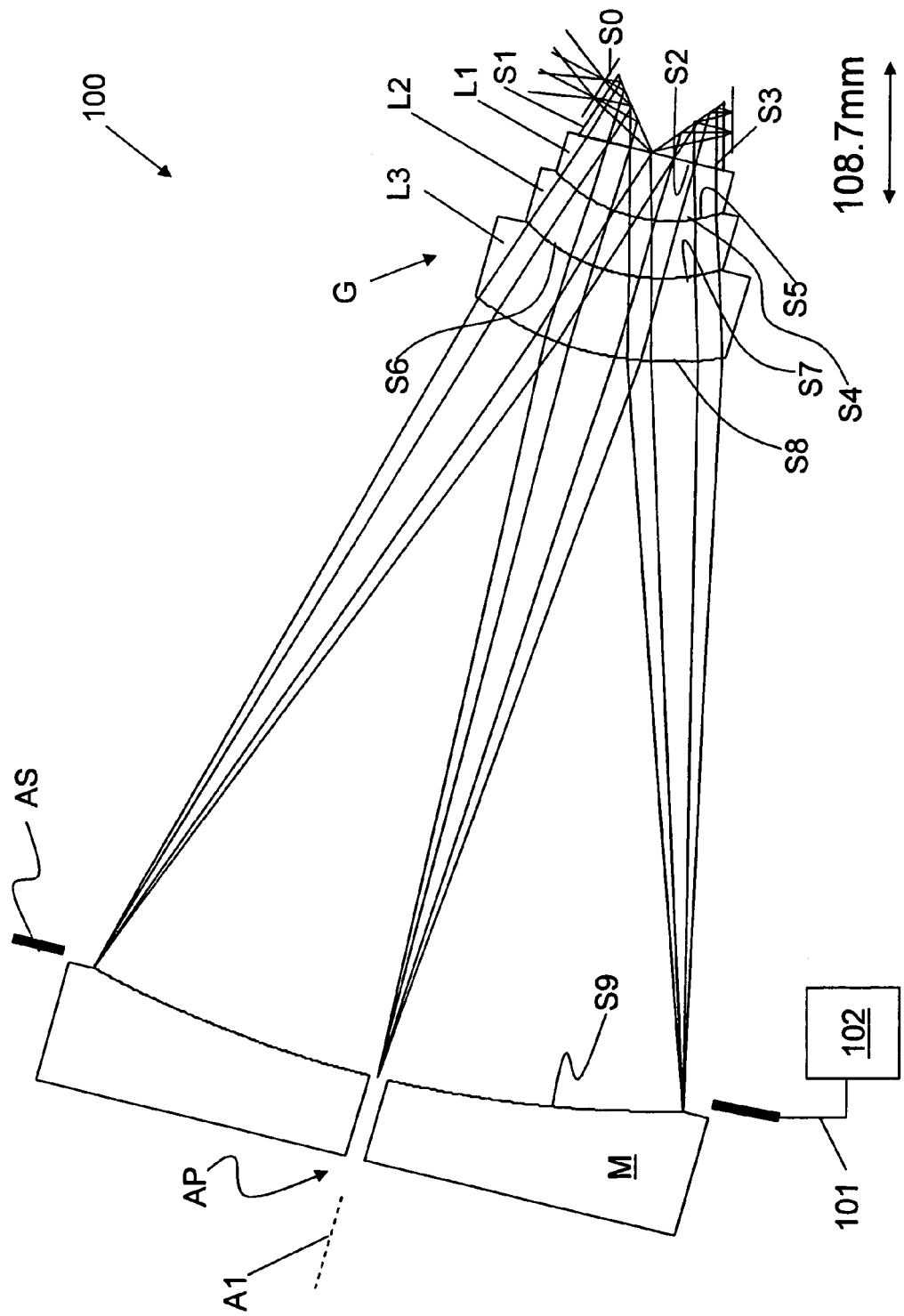
FIG. 3 is cross-sectional diagram of a second example embodiment of the unit-magnification projection optical system of the present invention having a cemented three-element main lens group.
Figure 4:
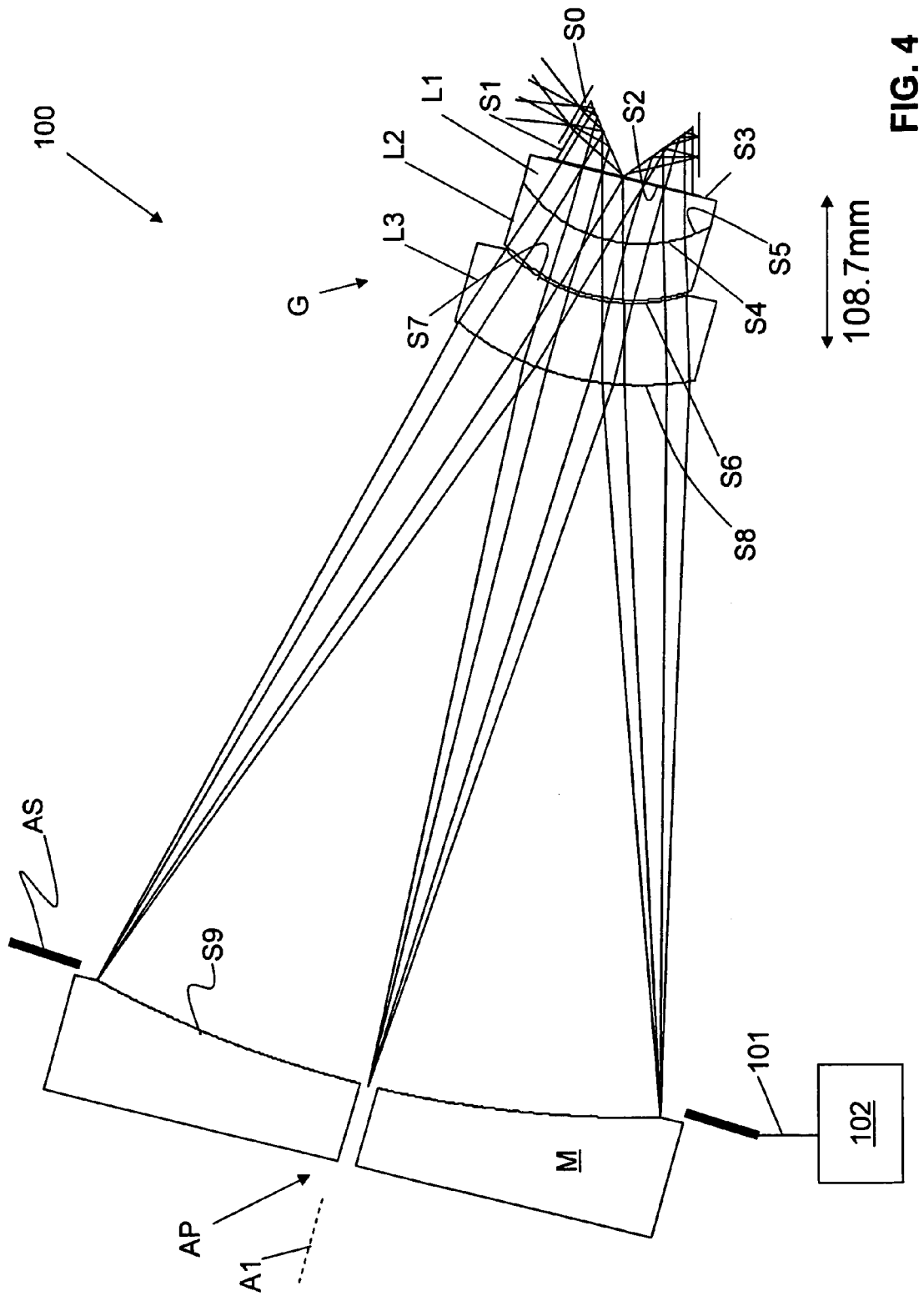
FIG. 4 is cross-sectional diagram of a third example embodiment of the unit-magnification projection optical system of the present invention having an air-spaced three element main lens group.

FIGS. 2, 3, and 4 are cross-sectional diagrams of example embodiments of unit-magnification projection optical systems 100 of the present invention. Projection optical system 100 of FIGS. 2, 3 and 4 includes, along an optical axis A1, a concave spherical mirror M. In an example embodiment, mirror M includes an aperture AP on the optical axis. Aperture AP may be used, for example, to extract light from the projection optical system for performing functions other than direct imaging with optical system 100, such as for aligning the image of an object (e.g., a mask) with a similar pattern on a wafer.

In an example embodiment, optical system 100 further includes a fixed or variable aperture stop AS located at mirror M. If a variable aperture stop AS is used, it may include any one of the known forms of varying the size of an aperture in an optical system, such as an adjustable iris.

In another example embodiment, the size of variable aperture stop AS is manually set. In yet another example embodiment, variable aperture stop AS is operatively connected via a line 101 (e.g., a wire) to a controller 102 that allows for automatically setting the size of the aperture stop. The aperture stop AS defines the NA of the projection optical system, which in example embodiments of the present invention ranges from 0.16 to 0.4, depending on the desired exposure field size, and the spectral range of aberration correction. Either a variable or fixed AS could be used with each of the embodiments of the tables. In the embodiments with the higher values of NA, a variable AS would normally be used. Whereas for the lowest values of NA where there is not as broad a range of values over which the value of NA can be varied a fixed AS is more likely to be used. In summary whether or not AS is fixed or variable is a mater of design choice that is based on the value or values of NA needed for an application taking into account breath of the range of the value of NA needed.

Optical system 100 further includes a field corrector (e.g., main) lens group G with positive refractive power arranged along axis A1 adjacent to, and spaced apart from mirror M on the concave side of the mirror.

Figure 5:
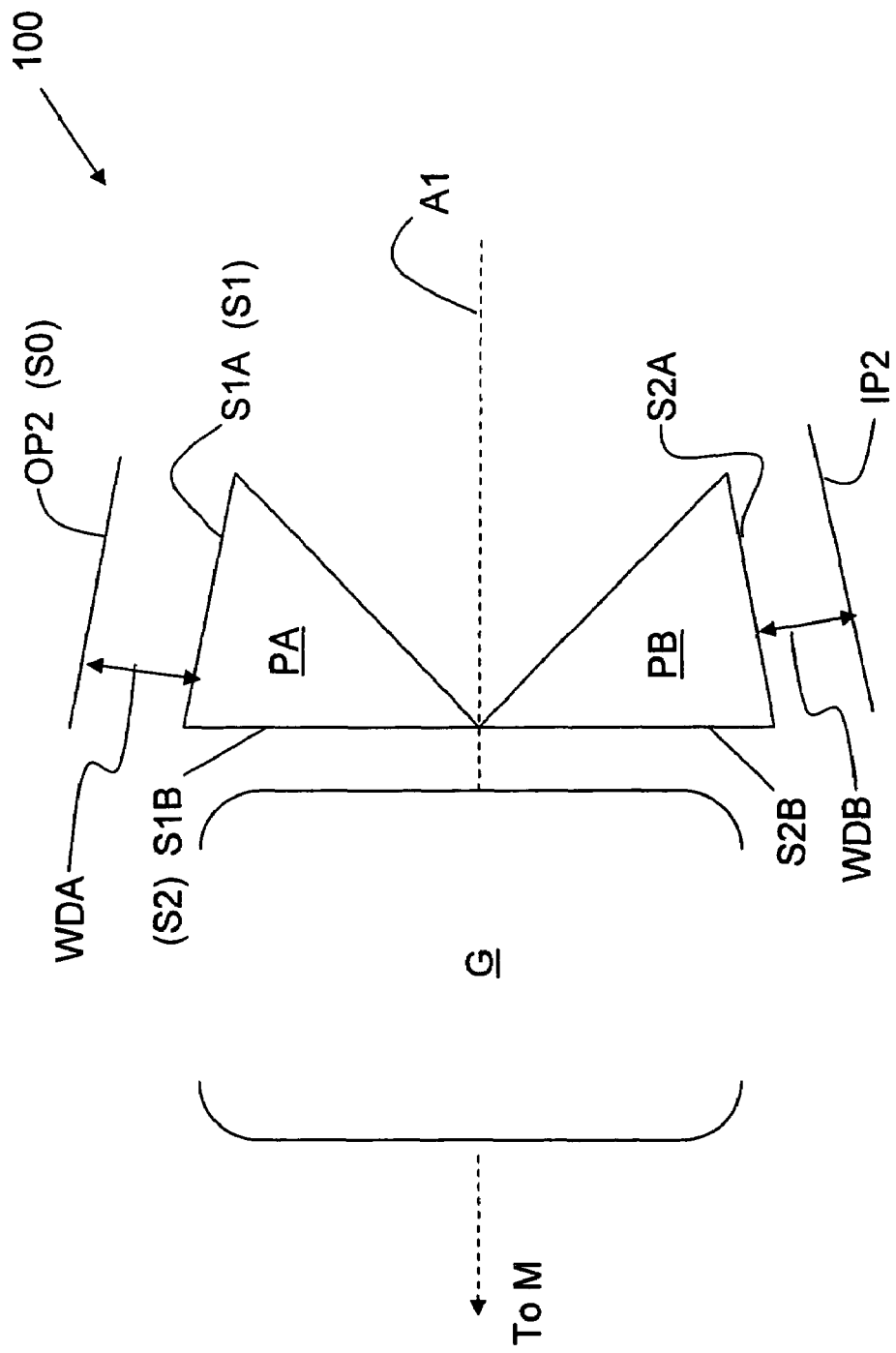
FIG. 5 is a schematic close-up view of a portion of the unit-magnification projection optical system of the present invention that includes the main lens group, the prisms, and the respective object and image planes.

FIG. 5 is a schematic close-up view of a portion of the unit-magnification projection optical system 100 of FIGS. 1 through 4, showing the main lens group G and adjacent prisms PA and PB. With reference to FIG. 5, adjacent to main lens group G and opposite to mirror M is the first prism PA located on one side of the optical axis A1. Prism PA has surfaces S1A and S1B. Prism PB is located symmetrically on the opposite side of optical axis A1 and has surfaces S2A and S2B. Surface S1A faces an object plane OP2 which is parallel to surface S1A, and surface S2A faces an image plane IP2 that is parallel to surface S2A. Surfaces S1B and S2B face main lens group G.

Object plane OP2 and image plane IP2 are spaced apart from respective flat surfaces S1A and S2A by respective gaps WDA and WDB representing working distances. In example embodiments where there is complete symmetry with respect to variable aperture stop AS, i.e. WDA=WDB. Since WDA and WDB are equal to each other, in the accompanying Tables 1–7 these distances are referred to as WD.

Although prisms PA and PB are not included in main lens group G, these prisms play a role in the aberration correction, including chromatic aberration correction, as described above.

With reference again to FIGS. 2–4, in an example embodiment, mirror M is aspherized to improve performance of the designs for large-field, high NA applications. All the example embodiments of the system of the present invention essentially preserve the system symmetry relative to the variable aperture stop AS, which inherently eliminates the odd-order aberrations such as coma, distortion, and lateral color. Optical system 100 includes no concentric lens elements in main lens group G or lens surfaces that are concentric with the concave mirror M.

Example Designs

Example embodiments of optical system 100 are apparent from the designs set forth in Tables 1 through 7, as illustrated in the schematic optical system diagrams of FIGS. 2–4 and the focus-versus-wavelength plots of FIGS. 6–14.

Because of the symmetry of optical system 100 shown in each of FIGS. 2–4, the specifications set forth in Tables 1 through 7 only include values from object plane OP2 to concave mirror M. In the Tables, light is assumed to travel through the surfaces in order of their numerical sequence. A positive radius indicates the center of curvature is located on the side opposite the initial direction of the light incident on the surface and a negative radius indicates the center of curvature is located on the same side of the light incident on the surface. Thus, a refracting or reflecting surface that is convex with respect to the incident light has a positive radius while a surface that is concave relative to the incident ray will have a negative radius of curvature. Further clarification of the sign convention can be obtained by comparing the tabulated design with the corresponding design examples shown in each of FIGS. 2, 3 and 4. The thickness of an element, or the separation between elements, is the axial distance to the next surface, and all dimensions are in millimeters. Further, "S" stands for surface number, e.g. as labeled in FIGS. 2 through 4, "T or S" stands for "thickness or separation", and "STOP" stands for "aperture stop AS". Also, "CC" stands for "concave" and "CX" stands for "convex."

Further, under the heading of "material", both the glass name and the six-digit internationally known and accepted convention for optical material designation are listed. For example, 516643 denotes BK7 glass and this designation implies that BK7 has a refractive, $N_d$, of about 1.516 in the helium d-line, and an Abbe number of about 64.3 relative to the d-line and the C and F-lines of hydrogen. The Abbe number, $V_d$, is defined by the equation $V_d=(N_d-1)/(N_F-N_C)$, where $N_F$ and $N_C$ are the refractive index values of the glass at the F and C lines.

Further, under the heading "surface shape", an aspheric surface is denoted by "ASP", a flat surface by "FLT" and a spherical surface by "SPH".

The aspheric equation describing an aspherical surface is given by:

$$Z = \frac{(CURV)Y^2}{1+(1-(1+K)(CURV)^2Y^2)^{1/2}} + $$
$$(A)Y^4 + (B)Y^6 + (C)Y^8 + (D)Y^{10} + (E)Y^{12}$$

wherein "CURV" is the spherical curvature of the surface, K is the conic constant, and A, B, C, D, and E are the aspheric coefficients. In the Tables, "e" denotes exponential notation (powers of 10). The design examples set forth in Tables 1–3 are design examples where the curvatures of the dioptric powered surfaces of the lens elements and the mirror are spherical. The design examples set forth in Tables 4A, 4B, 4C, and 7 include an aspheric surface for mirror M. The design examples set forth in Tables 5 and 6 include an aspherical surface for the convex surface of lens element L3.

Two-element Main Lens Group

FIG. 2 is a cross-sectional diagram of the projection optical system of the present invention, wherein the main lens group G consists of two elements. In particular, lens group G consists of a cemented doublet having a plano-convex element L1 and a negative meniscus element L2. Tables 1 and 2 set forth example apochromatic design embodiments having an NA of 0.20 and field radius of 42 mm.

Figure 6:
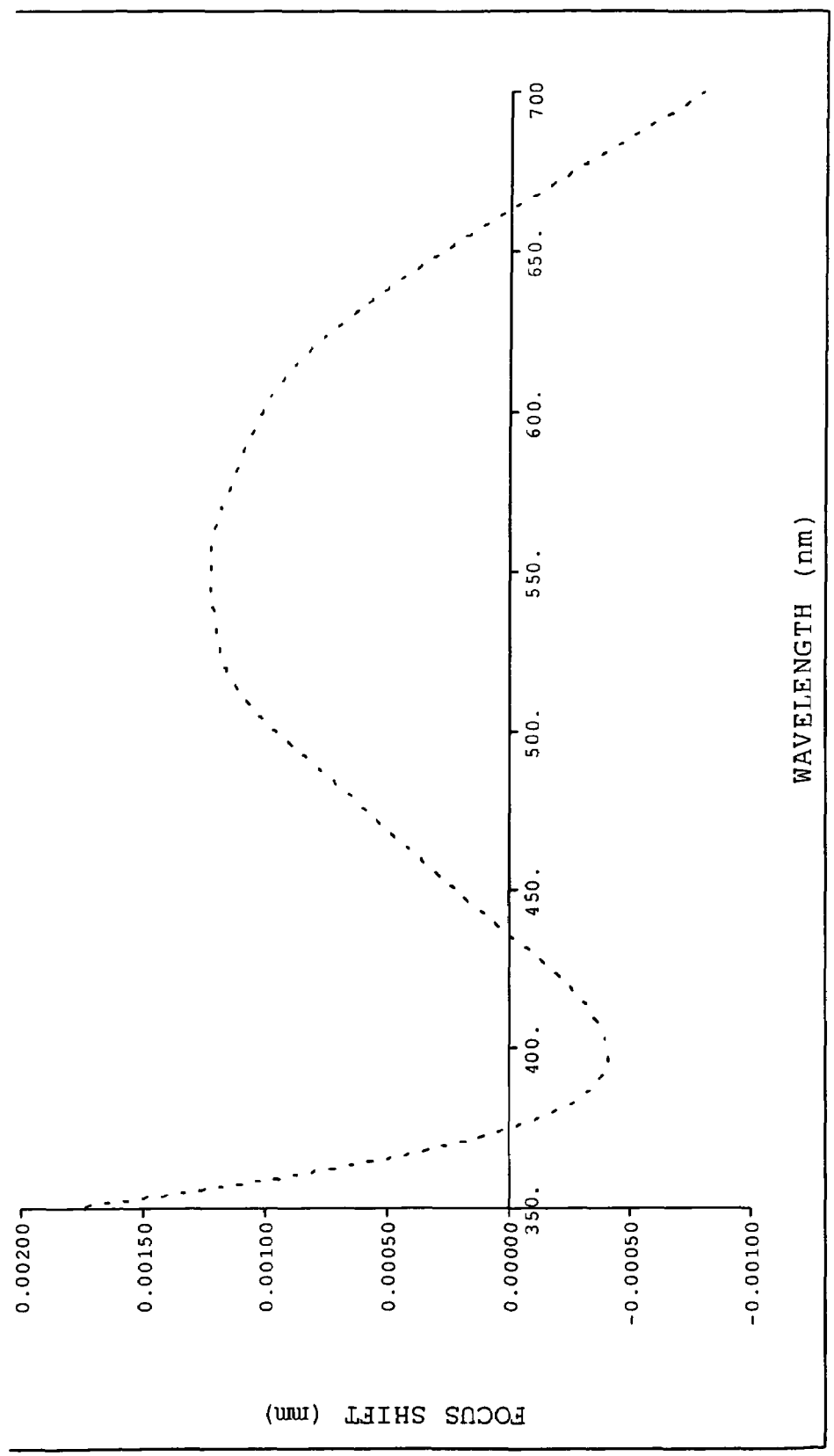
FIG. 6 is a plot of the variation in focus as a function of wavelength for the optical design of Table 1 and illustration in FIG. 2.

FIG. 6 is a plot of the variation in focus versus wavelength for the apochromatic optical design embodiment set forth in Table 1. The plot of FIG. 6 shows color correction at three discrete wavelengths whose values are indicated by the crossing or intersection points on the plot in the wavelength axis where the focal shifts are equal to zero. These wavelengths are approximately 375 nm, 435 nm and 663 nm, however they can vary depending on the nominal focus position. The plot also shows achromatization over the exposure band, and reveals the occurrence of a third coincident focus over the extended band pass that includes the exposure band and the alignment band. The achromatization in the exposure band occurs at the two discrete wavelengths where the plot intersects the wavelength axis and whereby these tow wavelengths are essentially within the exposure band (365 nm to 436 nm or the g, h, I spectrum range). The portion of the spectrum near the third intersection point, which occurs outside the exposure band in the far visible region, is essentially used as the alignment wavelength band.

Figure 7:
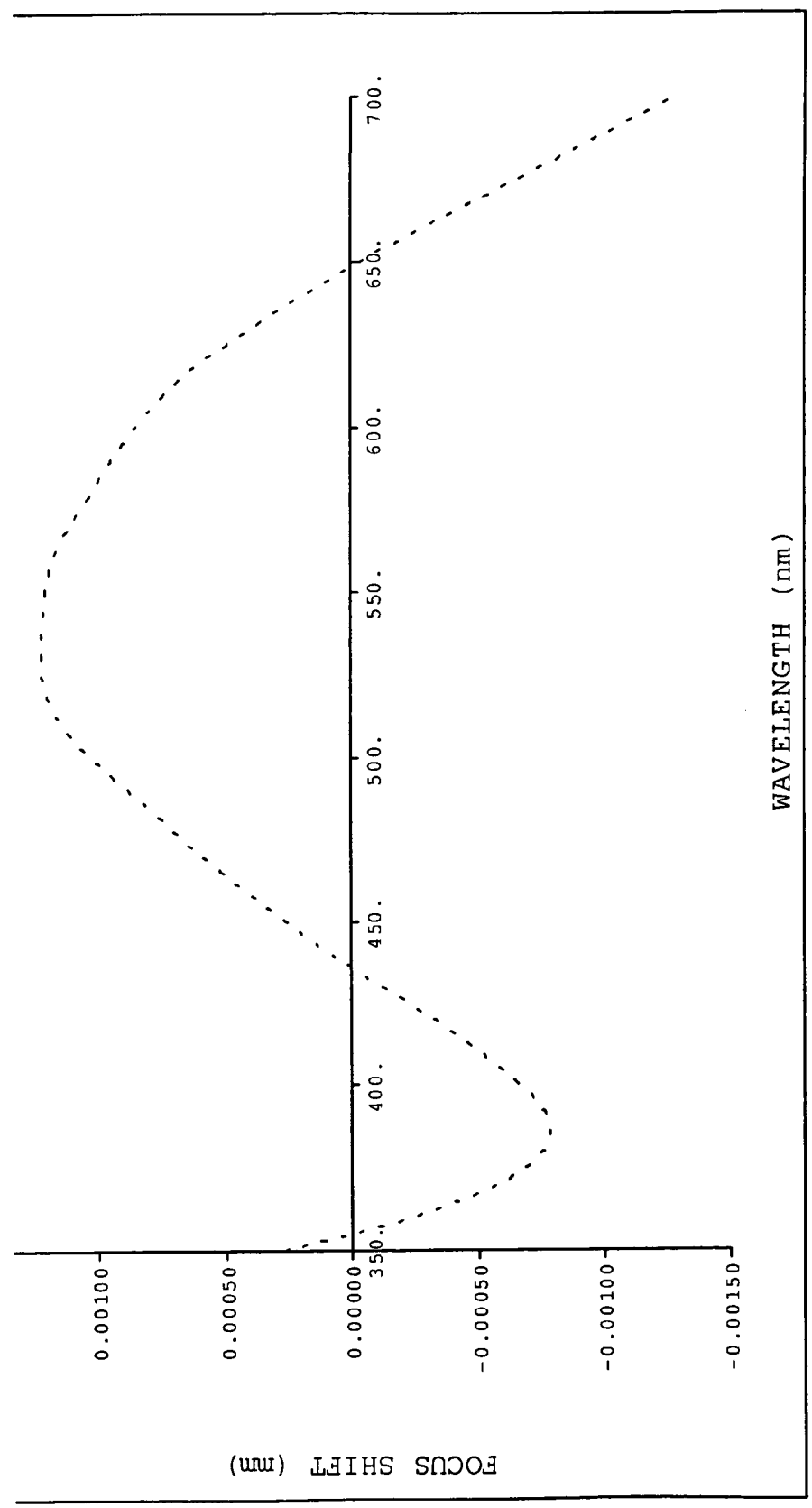
FIG. 7 is a plot of the variation in focus as a function of wavelength for the optical design of Table 2 and illustration in FIG. 2.
Figure 8:
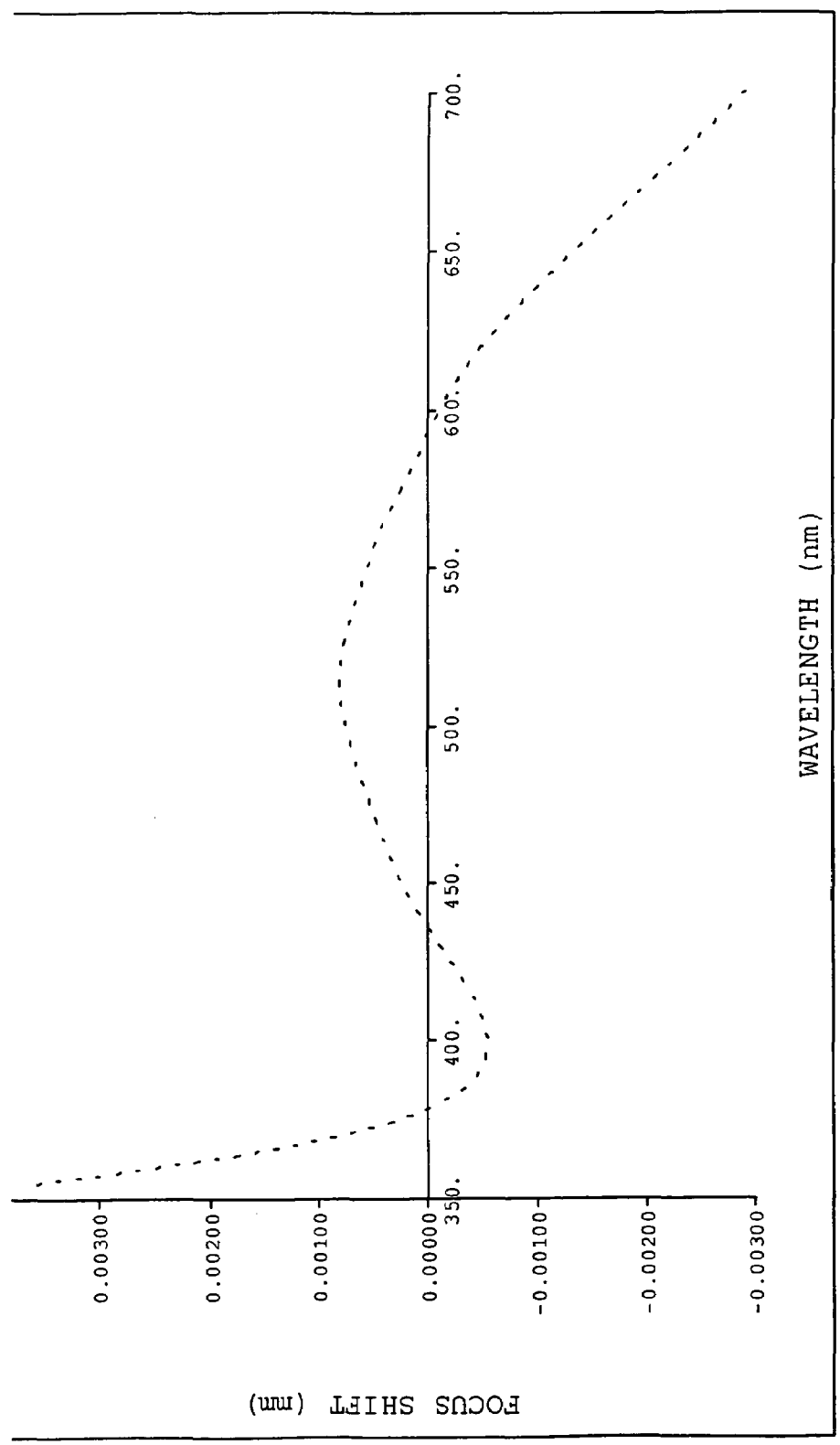
FIG. 8 is a plot of the variation in focus as a function of wavelength for the optical design of Table 3 and illustration in FIG. 3.
Figure 9:
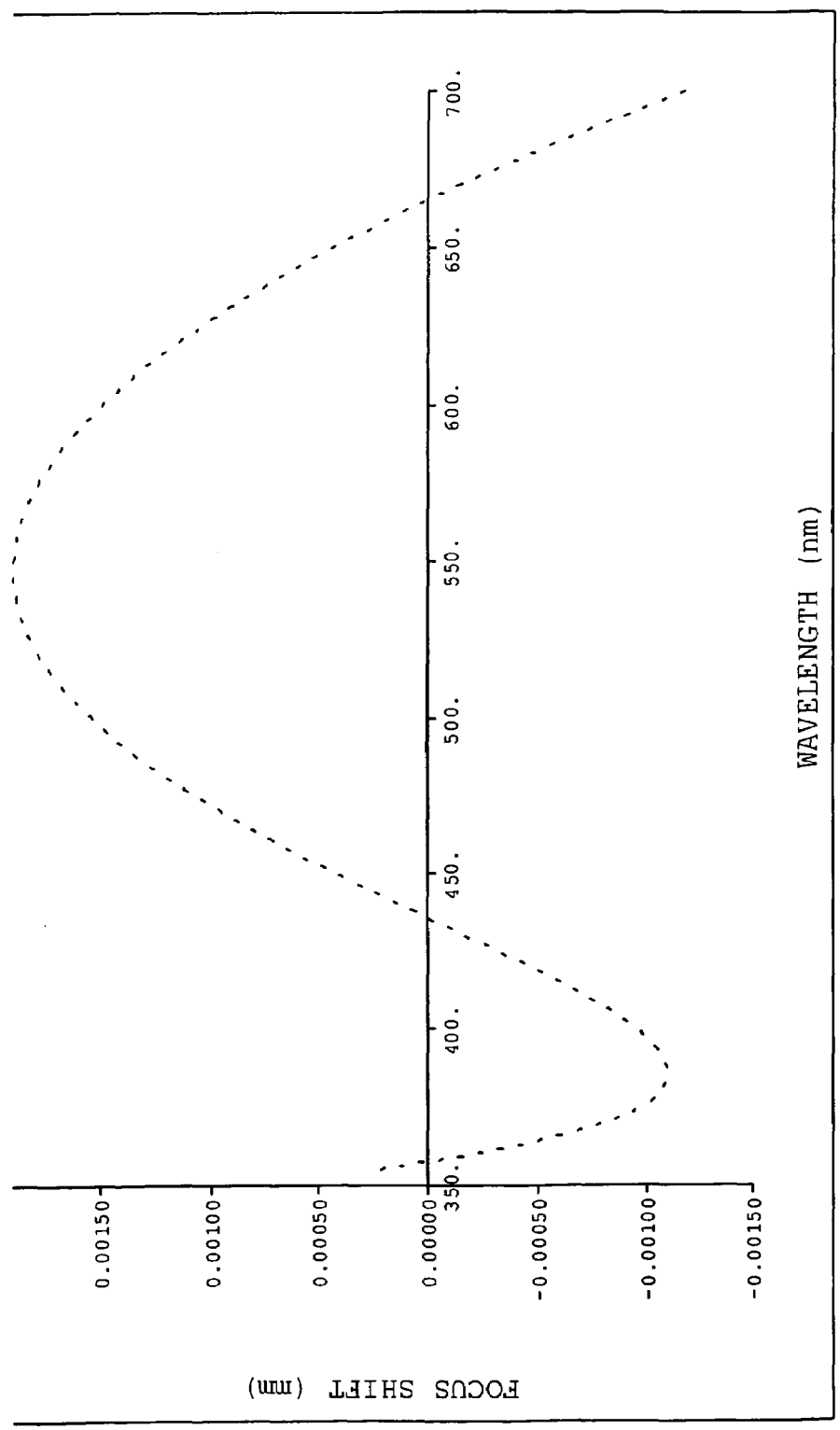
FIG. 9 is a plot of the variation in focus as a function of wavelength for the optical design of Table 4A and illustration in FIG. 3.
Figure 10:
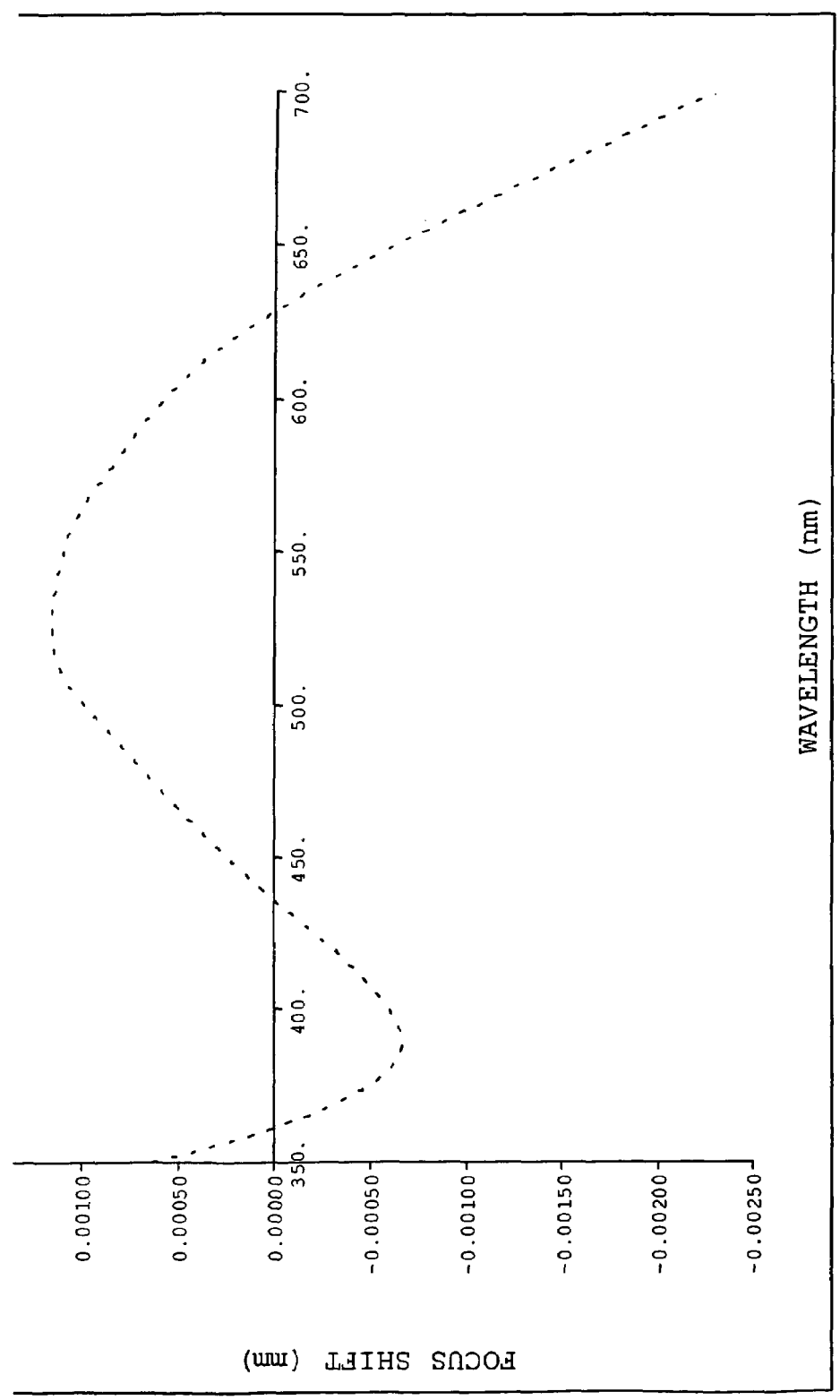
FIG. 10 is a plot of the variation in focus as a function of wavelength for the optical design of Table 4B and illustration in FIG. 3.
Figure 11:
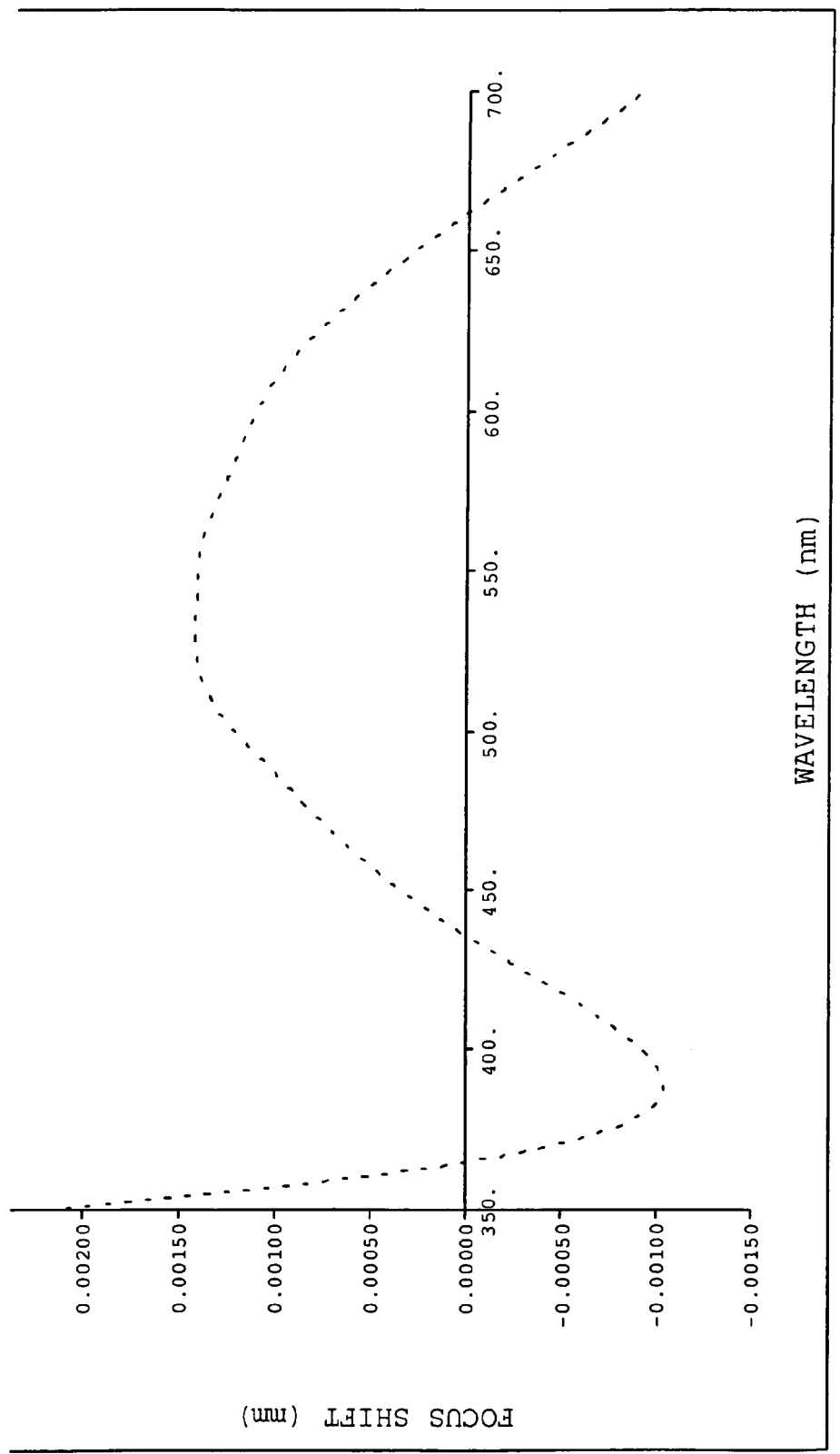
FIG. 11 is a plot of the variation in focus as a function of wavelength for the optical design of Table 4C and illustration in FIG. 3.

FIG. 7 is a plot similar to that of FIG. 6, for the optical design set forth in Table 2. As in FIG. 6, the plot of FIG. 7 shows color correction at three discrete wavelengths over the extended band-pass that includes the exposure and alignment bands. These three discrete wavelengths are at the crossing or intersection points of the plot in the wavelength axis where the focal shifts are equal to zero (i.e. at 355 nm, 436 nm and 650 nm).

Main Lens Group with Cemented Triplet

FIG. 3 is a cross-sectional schematic diagram of the projection optical system of the present invention, wherein the main lens group consists of three elements. In particular, lens group G consists of a cemented triplet having lens elements L1, L2, and L3.

There are two cases for the dioptric power distribution of lens elements L1, L2 and L3 in the example embodiment of FIG. 3. For Case I, L1 is + (positive power), L2 is − (negative power), and L3 is + (positive power). For Case II, L1 is + (positive power), L2 is − (negative power), and L3 is − (negative power). The lens element L1 is plano-convex for both Case I and II. An example optical prescription of an apochromatic design embodiment of Case I is given in Table 3. Example apochromatic design embodiments having the Case II configuration are given in Tables 4A, 4B, and 4C. Note that in each of Tables 4A, 4B and 4C surface 9 is indicated as being aspheric and the aspheric constants k, A, B, C, and D are noted below surface 9 in each of the tables. The aspheric constants are defined by the equation above defining the surface sag Z.

One of the more troublesome aberrations with optical designs that attempt to span a wide wavelength range is known as axial color, which is simply the variation of the best focus position with wavelength, or the total variation of the best focus position over the design wavelength range. FIGS. 8 through 11 are plots showing the variation of best focus as a function of wavelength for the apochromatic design embodiments in Tables 3, 4A, 4B, and 4C, respectively. These Figures illustrate the color correction, the control of axial color or focus position as a function of wavelength in the exposure and alignment wavelength bands. Perfect color correction, i.e. perfect coincidence with the nominal focus position, occurs at the two discrete wavelengths where each plot intersects the wavelength axis and whereby these two wavelengths are essentially within the exposure band (365 nm to 436 nm or the g, h, I spectrum range). The third intersection point occurring outside this exposure band in the far visible region is essentially used as the alignment wavelength band. At these three discrete wavelengths, where the plot intersects the wavelength axis, the focal shifts are identically equal to zero implying that the axial chromatic aberration at these wavelengths is zero. The process of designing a system having a small variation in best focus across the design wavelength band is known as achromatization. An optical design having a small variation in best focus across the design wavelength band is "achromatized".

Superachromatic design embodiments are given by the design examples in Tables 5 and 6, and these embodiments both have the same optical design form schematically illustrated in FIG. 3. The example embodiments set forth in Tables 5 and 6 are for large-field (80 mm field radius) systems having respective NAs of 0.16 and 0.18. These embodiments provide a square field of about 61.5 mm×61.5 mm, and a rectangular exposure field size of at least 50 mm×100 mm.

Figure 12A:
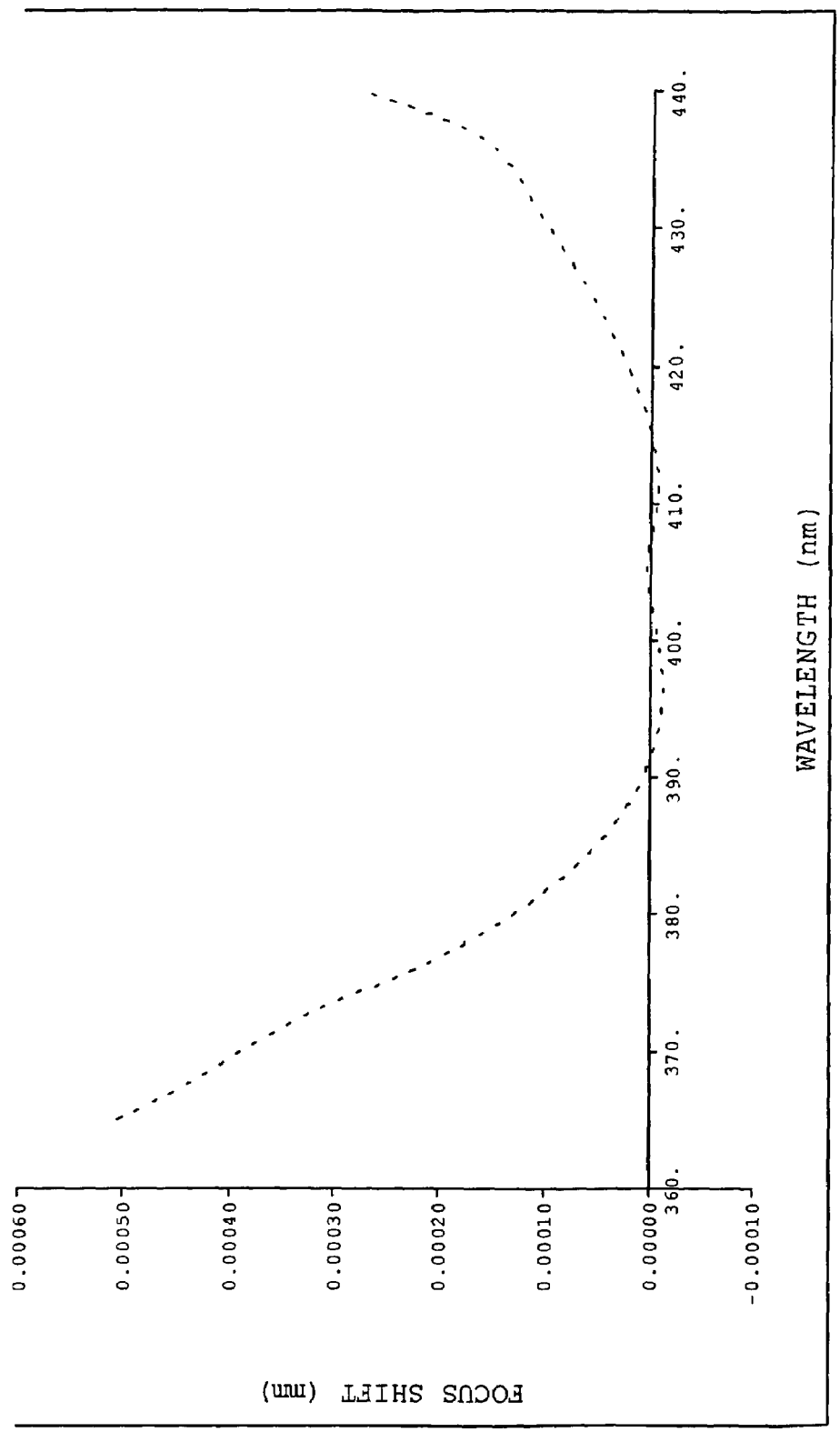
FIG. 12A is a plot of the variation in focus as a function of wavelength for the optical design of Table 5, showing the superachromatic color-correction at four wavelengths in the exposure band.
Figure 12B:
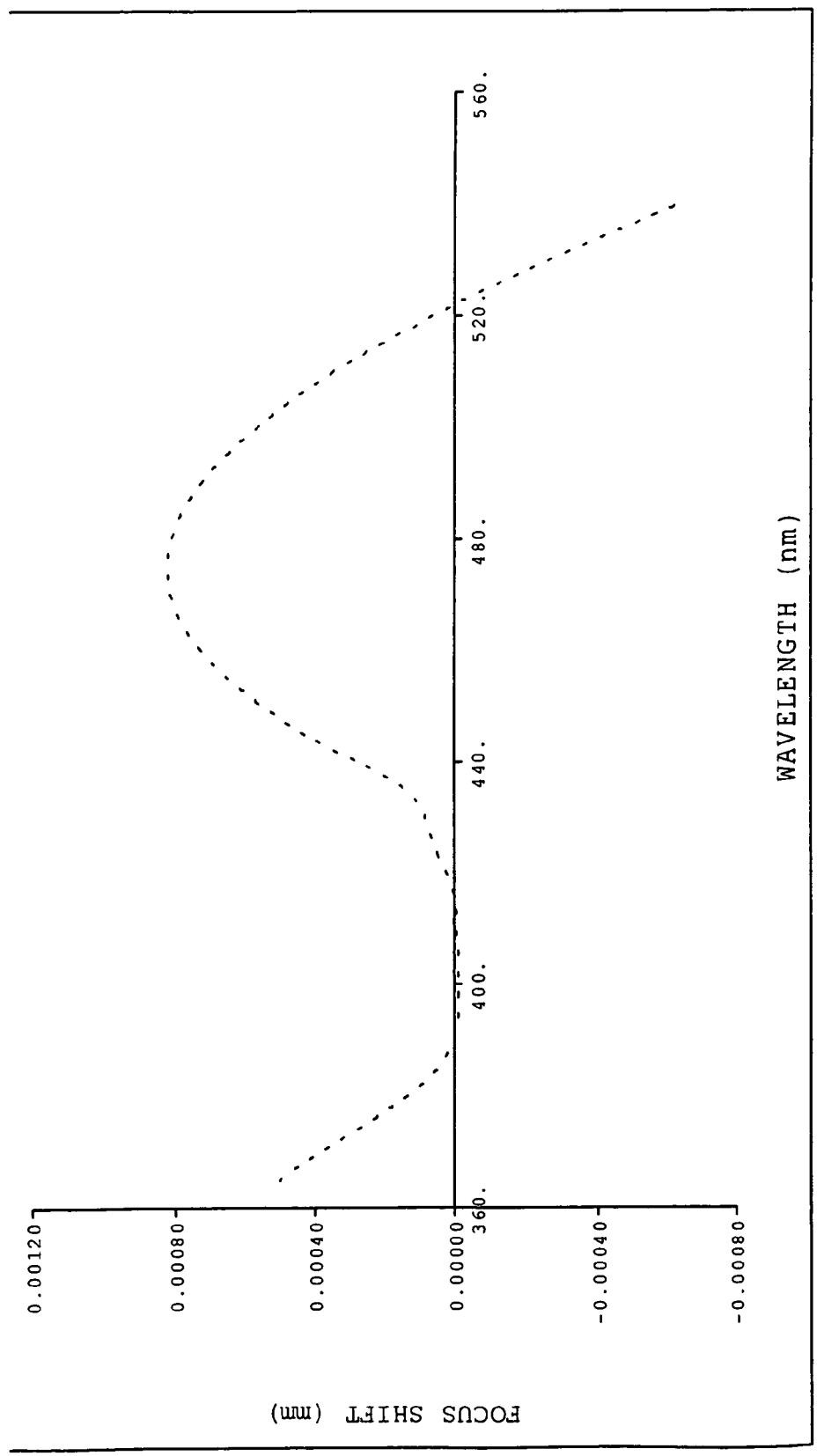
FIG. 12B is a plot of the variation in focus as a function of wavelength for the optical design of Table 5, showing the superachromatic color-correction at five wavelengths over the extended band pass that includes both the exposure and alignment bands.

FIGS. 12A and 12B are plots showing the variation of focus as a function of wavelength for the superachromatic design embodiment in Table 5. FIG. 12A illustrates superachromatic color correction at four wavelengths, 391 nm, 402 nm, 408 nm and 414 nm in the exposure band. FIG. 12A is a scaled up or magnified plot of the exposure band portion of the plot in FIG. 12B, indicating the four crossing or intersection points of the focal shift plot with the wavelength axis occurring within the exposure band (365 nm to 436 nm or the g, h, I spectrum range). The fifth intersection point, shown in the extended plot in FIG. 12B, occurs outside this exposure band in the visible region at 522 nm where alignment might be done. At these five discrete wavelengths where the plot in FIG. 12B intersects the wavelength axis, the focal shifts are identically equal to zero implying that the axial chromatic aberration at these wavelengths is zero.

Figure 13:
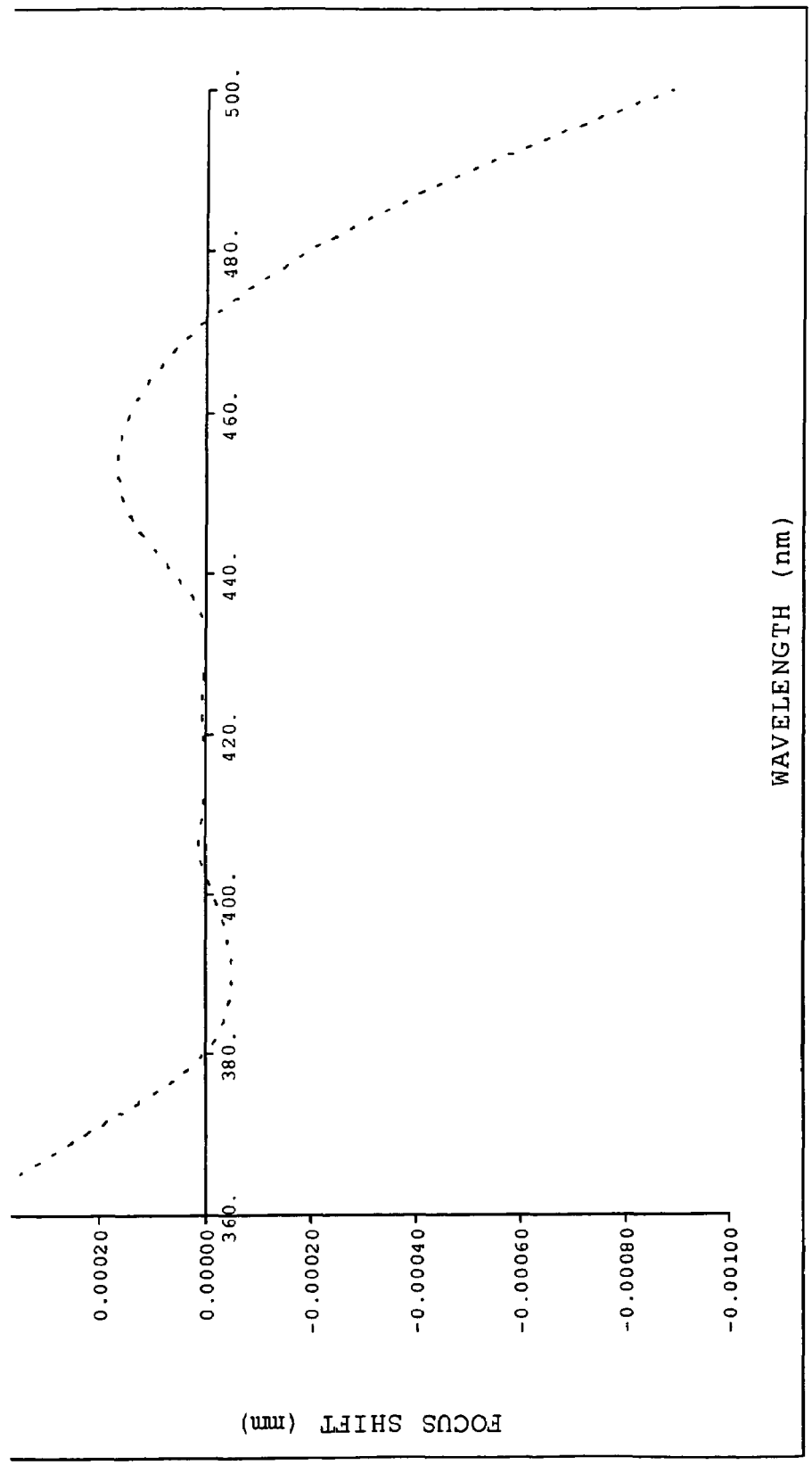
FIG. 13 is a plot of the variation of focus as a function of wavelength for the optical design of Table 6, showing superachromatic color correction at five wavelengths in the exposure band and color-correction at six wavelengths over the extended band pass that includes the exposure and alignment bands.

FIG. 13 is a plot of the variation of focus position as a function of wavelength for the superachromatic design embodiment with optical prescription in Table 6. This plot illustrates superachromatic color correction at five wavelengths, 380 nm, 402 nm, 416 nm, 428 nm and 435 nm in the exposure band and color correction at a sixth wavelength, 417 nm, in the visible alignment band.

Main Lens Group with Air-spaced Triplet

FIG. 4 is a cross-sectional schematic diagram of an example embodiment of the projection optical system of the present invention, wherein the main lens group consists of three lens elements L1, L2 and L3 with an air space between elements L2 and L3.

The optical prescription of an example apochromatic design embodiment with the system configuration illustrated in FIG. 4 is set forth in Table 7.

Figure 14:
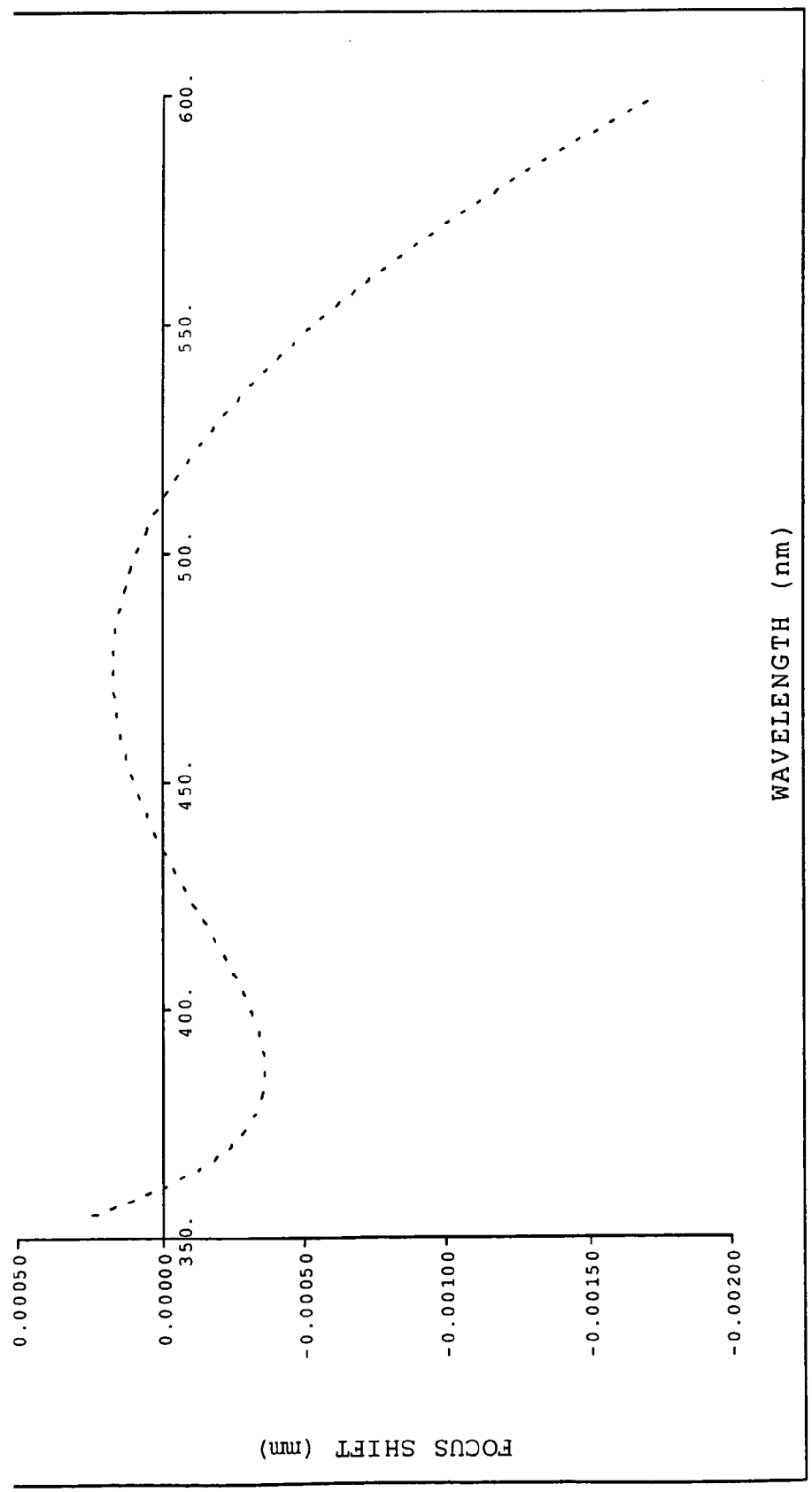
FIG. 14 is a plot of the variation in focus as a function of wavelength for the optical design of Table 7 and illustration in FIG. 4.

FIG. 14 is a plot showing the variation of focus as a function of wavelength for the apochromatic design embodiments in Table 7, for an extended bandpass that includes the exposure and alignment bands. The plot of FIG. 14 illustrates three common foci at 361 nm, 434 nm and 513 nm, with two of the foci in the exposure band, 365 nm–436 nm, and one focus in the alignment band.

Photolithography System

Figure 15:
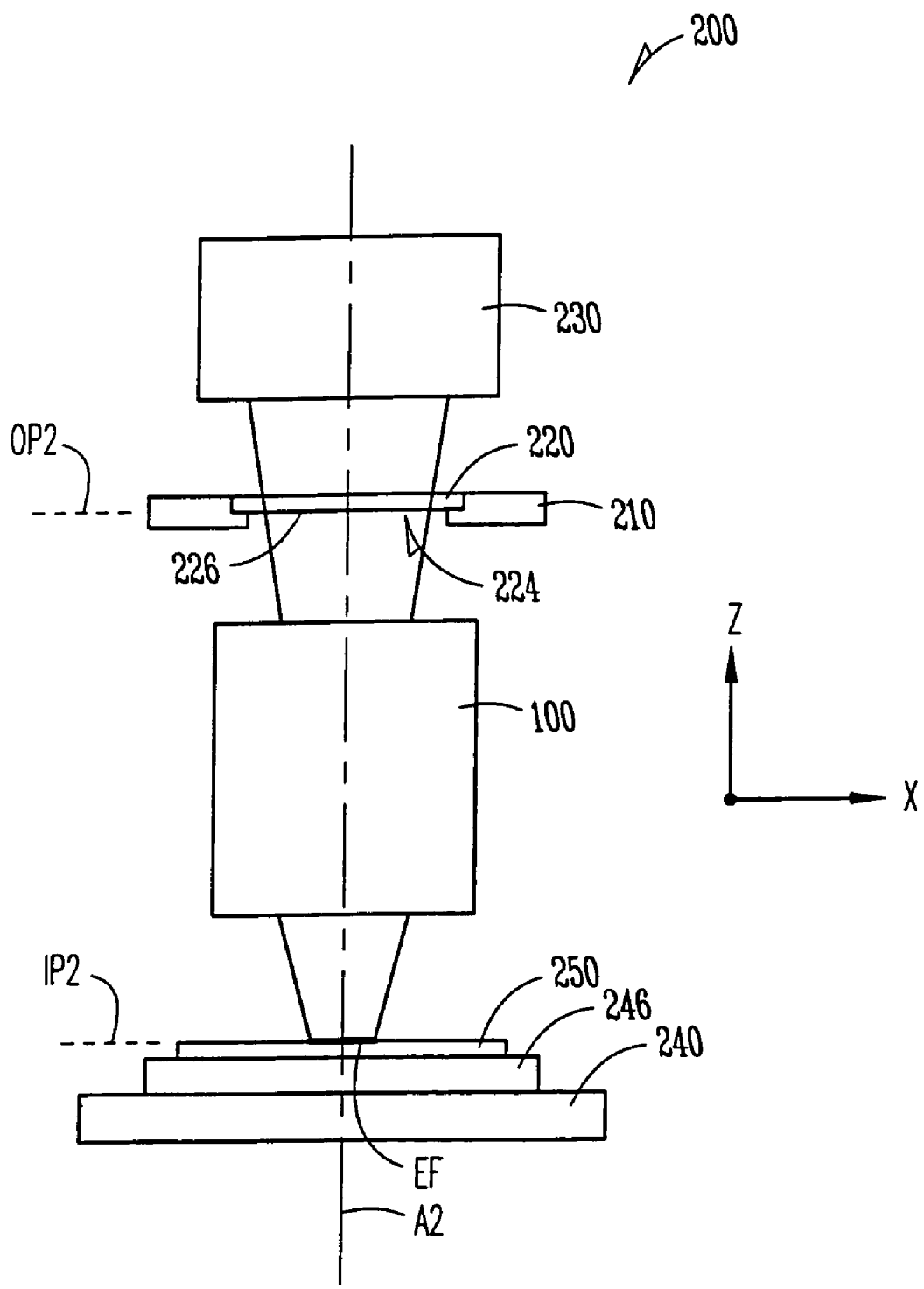
FIG. 15 is a schematic diagram of a photolithography system employing the unit-magnification projection optical system of the present invention.

FIG. 15 is a schematic diagram of a photolithography system 200 employing the unit-magnification projection optical system 100 of the present invention. System 200 has an optical axis A2 and includes along the optical axis a mask stage 210 adapted to support a mask 220 at object plane OP2. Mask 220 has a pattern 224 formed on a mask surface 226. An illuminator 230 is arranged adjacent mask stage 210 opposite optical system 100 and is adapted to illuminate mask 220.

System 200 also includes a wafer stage 240 adapted to movably support a wafer 246 at image plane IP2. In an example embodiment, wafer 246 is coated with a photosensitive layer 250 that is activated by one or more wavelengths of radiation from the illuminator. Such radiation is referred to in the art as "actinic radiation". In an example embodiment, the one or more wavelengths of radiation include the mercury g, h and I lines.

With continuing reference to FIG. 15, in operation, illuminator 230 illuminates mask 220 while stage 240 is stationary so that pattern 224 is imaged at wafer 246 by optical system 100, thereby forming a pattern in photoresist layer 250. The result is an exposure field EF that occupies a portion of the wafer. Wafer stage 240 then moves ("steps") wafer 246 in a given direction (e.g., the x-direction) by a given increment (e.g., the size of one exposure field EF), and the exposure process is repeated. This step-and-expose process is repeated (hence the name "step-and-repeat" until a desired number of exposure fields EF are formed on wafer 246.

The wafer is then removed from system 200 (e.g., using a wafer handling system, not shown) and processed (e.g., developed, baked, etched, etc.) to transfer the pattern formed in the photoresist in each scanned exposure field EF to the underlying surface on the wafer. Repeating this photolithography process with different masks allows for three-dimensional structures to be formed in the wafer and the creation of operational devices, such as ICs. Further, by varying the NA of system 100, exposure fields EF having different sizes and different resolution levels can be set to correspond to a given mask, thus improving the flexibility of the lithography process.

The projection optical system of the present invention can be manufactured using standard optical fabrication and testing technologies. The moderately high numerical aperture designs, $0.30 \leq NA \leq 0.40$ are suitable for moderate resolution layers and for "mix-and-match" applications. The NA=0.4 designs are suitable for i-line exposure if submicron high-resolution is desired. The occurrence of a focus in the visible spectrum, coincident with the foci at the achromatized wavelengths in the exposure band enables alignment of the mask and the wafer without refocusing.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

TABLE 1

| NA | Field Height (mm) | Design Wavelengths (nm) |
|---|---|---|
| 0.20 | 42.00 | 435.8, 404.7, 365.01 |

| | SURFACE DESCRIPTION | | | | |
|---|---|---|---|---|---|
| S # | RADIUS | SHAPE | T or S | MATERIAL | ELEMENT DESCRIPTION |
| 0 | INF | FLT | 0.0000 | | Working distance WD |
| | | | 4.3834 | | |
| 1 | INF | FLT | 50.0000 | BSM51Y (603606) | Prism A/Prism B glass path |
| 2 | INF | FLT | 0.0000 | | |
| 3 | INF | FLT | 34.0000 | Fused Silica (458678) | L1 |
| 4 | −93.158 | CX SPH | 0.0000 | | |
| 5 | −93.158 | CC SPH | 128.0556 | PBL1Y (548458) | L2 |
| 6 | −211.753 | CX SPH | 583.5625 | | |
| 7 | −799.326 | CC SPH | | REFL(STOP) | Mirror M |

TABLE 2

| NA | Field Height (mm) | Design Wavelengths (nm) |
|---|---|---|
| 0.20 | 42.00 | 435.8, 404.7, 365.01 |

| | SURFACE DESCRIPTION | | | | |
|---|---|---|---|---|---|
| S # | RADIUS | SHAPE | T or S | MATERIAL | ELEMENT DESCRIPTION |
| 0 | INF | FLT | 0.0000 | | Working distance WD |
| | | | 4.6157 | | |
| 1 | INF | FLT | 50.0000 | BSM51Y (603606) | Prism A/Prism B glass path |
| 2 | INF | FLT | 0.0000 | | |
| 3 | INF | FLT | 29.0446 | Fused Silica (458678) | L1 |

TABLE 2-continued

| | | | | | | |
|---|---|---|---|---|---|---|
| 4 | −90.043 | CX | SPH | 0.0000 | | |
| 5 | −90.043 | CC | SPH | 137.1307 | PBL6Y (532490) | L2 |
| 6 | −215.953 | CX | SPH | 579.2098 | | |
| 7 | −799.517 | CC | SPH | | REFL(STOP) | Mirror M |

TABLE 3

| NA | Field Height (mm) | Design Wavelengths (nm) |
|---|---|---|
| 0.25 | 42.00 | 435.8, 404.7, 365.01 |

| S # | RADIUS | SURFACE DESCRIPTION SHAPE | T or S | MATERIAL | ELEMENT DESCRIPTION |
|---|---|---|---|---|---|
| 0 | INF | FLT | 0.0000 | | Working distance WD |
| 1 | INF | FLT | 3.7166 58.0000 | BAL15Y (557587) | Prism A/Prism B glass path |
| 2 | INF | FLT | 0.0000 | | |
| 3 | INF | FLT | 36.8922 | Fused Silica (458678) | L1 |
| 4 | −93.765 CX | SPH | 0.0000 | | |
| 5 | −93.765 CC | SPH | 55.7167 | PBL1Y (548458) | L2 |
| 6 | −222.004 CX | SPH | 0.0000 | | |
| 7 | −222.004 CC | SPH | 62.8024 | PBL26Y (567428) | L3 |
| 8 | −212.509 CX | SPH | 582.8725 | | |
| 9 | −800.247 CC | SPH | | REFL(STOP) | Mirror M |

TABLE 4A

| NA | Field Height (mm) | Design Wavelengths (nm) |
|---|---|---|
| 0.30 | 40.00 | 435.8, 404.7, 365.01 |

| S # | RADIUS | SURFACE DESCRIPTION SHAPE | T or S | MATERIAL | ELEMENT DESCRIPTION |
|---|---|---|---|---|---|
| 0 | INF | FLT | 0.0000 | | Working distance WD |
| 1 | INF | FLT | 6.0561 85.0000 | SK5 (589613) | Prism A/Prism B glass path |
| 2 | INF | FLT | 0.0000 | | |
| 3 | INF | FLT | 33.7875 | FK3 (464658) | L1 |
| 4 | −102.365 CX | SPH | 0.0000 | | |
| 5 | −102.365 CC | SPH | 77.4642 | LLF1 (548458) | L2 |
| 6 | −237.054 CX | SPH | 0.0000 | | |
| 7 | −237.054 CC | SPH | 50.6813 | LF5 (581409) | L3 |
| 8 | −241.426 CX | SPH | 648.0094 | | |
| 9 | −901.071 CC | ASP | | REFL(STOP) | Mirror M |

| S# | CURV | K | A | B | C | D |
|---|---|---|---|---|---|---|
| S9 | −0.00110979 | 0 | −3.79327e−13 | 1.94049e−17 | −1.45533e−21 | 4.51076e−26 |

TABLE 4B

| | Field Height | |
|---|---|---|
| NA | (mm) | Design Wavelengths (nm) |
| 0.40 | 38.00 | 435.8, 404.7, 365.01 |

SURFACE DESCRIPTION

| S # | RADIUS | | SHAPE | T or S | MATERIAL | ELEMENT DESCRIPTION |
|---|---|---|---|---|---|---|
| 0 | INF | | FLT | 0.0000 | | Working distance WD |
| | | | | 3.000 | | |
| 1 | INF | | FLT | 50.0000 | BAK2 (540597) | Prism A/Prism B glass path |
| 2 | INF | | FLT | 0.0000 | | |
| 3 | INF | | FLT | 49.7500 | Fused Silica (458678) | L1 |
| 4 | −100.736 | CX | SPH | 0.0000 | | |
| 5 | −100.736 | CC | SPH | 81.0550 | PBL6Y (532490) | L2 |
| 6 | −196.221 | CX | SPH | 0.0000 | | |
| 7 | −196.221 | CC | SPH | 58.0000 | PBL25Y (581408) | L3 |
| 8 | −239.346 | CX | SPH | 658.1974 | | |
| 9 | −900.012 | CC | ASP | | REFL(STOP) | Mirror M |

| S# | CURV | K | A | B | C | D |
|---|---|---|---|---|---|---|
| S9 | −0.00111110 | 0 | 2.47539e−14 | 1.58381e−18 | −7.24502e−24 | 1.04881e−28 |

TABLE 4C

| | Field Height | |
|---|---|---|
| NA | (mm) | Design Wavelengths (nm) |
| 0.40 | 38.00 | 435.8, 404.7, 365.01 |

SURFACE DESCRIPTION

| S # | RADIUS | | SHAPE | T or S | MATERIAL | ELEMENT DESCRIPTION |
|---|---|---|---|---|---|---|
| 0 | INF | | FLT | 0.0000 | | Working distance WD |
| | | | | 3.1851 | | |
| 1 | INF | | FLT | 50.0000 | BAL15Y (557587) | Prism A/Prism B glass path |
| 2 | INF | | FLT | 0.0000 | | |
| 3 | INF | | FLT | 50.0000 | Fused Silica (458678) | L1 |
| 4 | −100.296 | CX | SPH | 0.0000 | | |
| 5 | −100.296 | CC | SPH | 76.2256 | PBL6Y (532490) | L2 |
| 6 | −194.400 | CX | SPH | 0.0000 | | |
| 7 | −194.400 | CC | SPH | 62.7286 | PBL25Y (581408) | L3 |
| 8 | −238.899 | CX | SPH | 657.8610 | | |
| 9 | −899.889 | CC | ASP | | REFL(STOP) | Mirror M |

| S# | CURV | K | A | B | C | D |
|---|---|---|---|---|---|---|
| S9 | −0.00111125 | 0 | −1.30859e−13 | 1.80058e−18 | −1.85958e−23 | 1.90809e−28 |

TABLE 5

| NA | Field Height (mm) | Design Wavelengths (nm) |
|---|---|---|
| 0.16 | 80.00 | 435.8, 404.7, 365.01 |

SURFACE DESCRIPTION

| S # | RADIUS | SHAPE | T or S | MATERIAL | ELEMENT DESCRIPTION |
|---|---|---|---|---|---|
| 0 | INF | FLT | 0.0000 | | Working distance WD |
| | | | 8.0019 | | |
| 1 | INF | FLT | 80.0000 | BSM51Y (603606) | Prism A/Prism B glass path |
| 2 | INF | FLT | 0.0000 | | |
| 3 | INF | FLT | 95.7500 | Fused Silica (458678) | L1 |
| 4 | −148.918 CX | SPH | 0.0000 | | |
| 5 | −148.918 CC | SPH | 51.5000 | PBL25Y (581408) | L2 |
| 6 | −171.126 CX | SPH | 0.0000 | | |
| 7 | −171.126 CC | SPH | 103.0500 | PBL6Y (532490) | L3 |
| 8 | −325.999 CX | ASP | 861.7610 | | |
| 9 | −1200.792 CC | SPH | | REFL(STOP) | Mirror M |

| S# | CURV | K | A | B | C | D |
|---|---|---|---|---|---|---|
| S8 | −0.00306749 | 0 | 4.11217e−11 | −1.91174e−15 | 1.29280e−19 | −2.62051e−24 |

TABLE 6

| NA | Field Height (mm) | Design Wavelengths (nm) |
|---|---|---|
| 0.18 | 80.00 | 435.8, 404.7, 365.01 |

SURFACE DESCRIPTION

| S # | RADIUS | SHAPE | T or S | MATERIAL | ELEMENT DESCRIPTION |
|---|---|---|---|---|---|
| 0 | INF | FLT | 0.0000 | | Working distance WD |
| | | | 7.8384 | | |
| 1 | INF | FLT | 80.0000 | BSM51Y (603606) | Prism A/Prism B glass path |
| 2 | INF | FLT | 0.0000 | | |
| 3 | INF | FLT | 88.7335 | Fused Silica (458678) | L1 |
| 4 | −149.388 CX | SPH | 0.0000 | | |
| 5 | −149.388 CC | SPH | 67.0100 | PBL26Y (567428) | L2 |
| 6 | −187.024 CX | SPH | 0.0000 | | |
| 7 | −187.024 CC | SPH | 96.0000 | PBL6Y (532490) | L3 |
| 8 | −325.747 CX | ASP | 860.4965 | | |
| 9 | −1201.595 CC | SPH | | REFL(STOP) | Mirror M |

| S# | CURV | K | A | B | C | D |
|---|---|---|---|---|---|---|
| S8 | −0.00306987 | 0 | 4.53792e−11 | −1.91471e−15 | 1.37211e−19 | −2.85379e−24 |

TABLE 7

| | NA | Field Height (mm) | | Design Wavelengths (nm) | |
|---|---|---|---|---|---|
| | 0.40 | 36.00 | | 435.8, 404.7, 365.01 | |

| | | SURFACE DESCRIPTION | | | |
|---|---|---|---|---|---|
| S # | RADIUS | SHAPE | T or S | MATERIAL | ELEMENT DESCRIPTION |
| 0 | INF | FLT | 0.0000 | | Working distance WD |
| | | | 4.2347 | | |
| 1 | INF | FLT | 85.0000 | SK5 (589613) | Prism A/Prism B glass path |
| 2 | INF | FLT | 0.0000 | | |
| 3 | INF | FLT | 27.5000 | FK3 (464658) | L1 |
| 4 | −104.213 CX | SPH | 0.0000 | | |
| 5 | −104.213 CC | SPH | 74.0000 | LLF1 (548458) | L2 |
| 6 | −182.614 CX | SPH | 2.5000 | | |
| 7 | −172.827 CC | SPH | 55.9368 | LF5 (581409) | L3 |
| 8 | −222.705 CX | SPH | 650.8290 | | |
| 9 | −900.612 CC | ASP | | REFL(STOP) | Mirror M |

| S# | CURV | K | A | B | C | D |
|---|---|---|---|---|---|---|
| S9 | −0.00111036 | 0 | −1.50626e−12 | −3.53983e−19 | −7.98769e−24 | 1.03540e−28 |

What is claimed is:

1. A projection optical system comprising along an optical axis:
   a concave spherical mirror;
   an aperture stop located at the mirror and centered on the optical axis, that determines a numerical aperture (NA) of the system;
   a positive lens group with positive refracting power arranged adjacent the mirror and spaced apart therefrom;
   first and second prisms each having respective first and second flat surfaces, wherein the second flat surfaces are arranged adjacent the positive lens on opposite sides of the optical axis, and wherein the first flat surfaces are arranged adjacent object and image planes, respectively; and
   wherein the projection optical system has unit magnification and has two or more common foci at respective two or more ultraviolet wavelengths and another common focus at a visible wavelength.

2. The projection optical system of claim 1, having three common foci at three ultraviolet wavelengths.

3. The projection optical system of claim 1, having four common foci at four ultraviolet wavelengths.

4. The projection optical system of claim 1, wherein the ultraviolet wavelengths are within an exposure band that includes g, h and i wavelengths.

5. The projection optical system of claim 2, wherein the visible wavelength falls within a visible alignment band that extends from 500 nm to 700 nm.

6. The projection optical system of claim 1, wherein the positive lens group consists of, in order towards the mirror, a positive lens and a negative lens.

7. The projection optical system of claim 6, wherein positive lens is a plano-convex lens with a mirror-facing convex surface, and the negative lens is a meniscus lens having a mirror-facing convex surface.

8. The projection system of claim 7, wherein the plano-convex lens element is formed from one of fused silica, silica glass, and glass type 458678.

9. The projection system of claim 7, wherein the negative meniscus lens element is formed from one of the glass types 548458 and 532490.

10. The projection optical system of claim 1, wherein the positive lens group consists of, in order towards the mirror, a positive lens and first and second negative meniscus lenses.

11. The projection optical system of claim 10, wherein the first and second negative meniscus lenses are separated by an air space.

12. The projection optical system of claim 1, wherein the mirror has an aspherical surface.

13. The projection optical system of claim 1, wherein the first and second prisms are each formed from a glass type selected from the glass types comprising: 603606, 557587, 589613, and 540597.

14. The projection optical system of claim 1, having a numerical aperture between 0.16 and 0.4, inclusive.

15. The projection optical system of claim 1, having a numerical aperture that is variable.

16. The projection system of claim 7, having a numerical aperture of between 0.20 and 0.40, inclusive.

17. The projection system of claim 1, wherein the positive lens group consists of, in order toward the mirror, a plano-convex lens with a mirror-facing convex surface, a negative meniscus lens having a mirror-facing convex surface, and a positive meniscus lens having a mirror-facing convex surface.

18. The projection optical system of claim 17, wherein the exposure band includes g, h and i wavelengths.

19. The projection optical system of claim 17, wherein the mirror has an aspherical surface.

20. The projection optical system of claim 17, wherein adjacent surfaces in the main lens group are in contact.

21. The projection optical system of claim 17, wherein the first and second prisms are each formed from the glass type 557587.

22. The projection optical system of claim 17, wherein the plano-convex lens element is formed from one of fused silica, silica glass, and glass type 458678.

23. The projection optical system of claim 17, wherein the negative meniscus lens element is formed from the glass type 548458.

24. The projection system of claim 23, wherein the positive meniscus lens element is formed from the glass type 567428.

25. The projection system of claim 17, having a numerical aperture numerical aperture of between 0.2 and 0.4, inclusive.

26. The projection optical system of claim 1, wherein the positive lens group consists of, in order towards the mirror: a plano-convex lens with a convex mirror-facing surface, a first negative meniscus lens having a mirror-facing convex surface, and a second negative meniscus lens having a mirror-facing convex surface.

27. The projection optical system of claim 26, in which the mirror has an aspherical surface.

28. The projection optical system of claim 26, wherein adjacent surfaces in the lens group are in contact with each other.

29. The projection optical system of claim 26, wherein the first and second prisms are each formed from a glass type selected from the group of glass types comprising: 603606, 557587, 589613, and 540597.

30. The projection optical system of claim 26, wherein the plano-convex lens element is formed from one of fused silica, silica glass, glass type 458678 and glass type 464658.

31. The projection system of claim 30, wherein the first negative meniscus element is formed from one of glass type 532490 and glass type 548458.

32. The projection system of claim 31, wherein the second negative meniscus element is formed from one of glass type 58108 and glass type 58109.

33. The projection system of claim 26, having a numerical aperture numerical aperture of between 0.16 to 0.40, inclusive.

34. A projection optical system according to claim 1, wherein the positive lens group consists of, in order towards the mirror: a plano-convex lens with a convex mirror-facing surface, a first negative meniscus lens having a mirror-facing convex surface, and a second negative meniscus lens having a mirror-facing convex surface and spaced apart from the first negative meniscus lens.

35. The projection optical system of claim 34, in which at least one lens element has an aspherical surface.

36. The projection optical system of claim 34, in which the mirror has an aspherical surface.

37. The projection optical system of claim 34, in which a pair of adjacent surfaces in the lens group are in contact.

38. The projection optical system of claim 34, wherein the first and second prisms are each formed from glass type 589613.

39. The projection system of claim 34, wherein the plano-convex lens element is formed from one of fused silica, silica glass, glass type 458678, and glass type 464658.

40. The projection system of claim 34, wherein the first negative meniscus element is formed from glass type 548458.

41. The projection system of claim 34, wherein the second negative meniscus lens is formed from one of the glass types 58108, and 58109.

42. The projection system of claim 34, having a numerical aperture of between 0.2 and 0.4, inclusive.

43. The projection optical system of claim 26, wherein the projection optical system includes at least four common foci within the exposure band.

44. The projection optical system of claim 43, including a fifth common focus at a visible wavelength.

45. The projection optical system of claim 43, in which at least one lens element has an aspherical surface.

46. The projection optical system of claim 43, in which the mirror has an aspherical surface.

47. The projection optical system of claim 43, in which a pair of adjacent surfaces in the lens group are in contact.

48. The projection optical system of claim 43, wherein the first and second prisms are each formed from glass type 603606.

49. The projection optical system of claim 43, wherein the plano-convex lens element is formed from one of fused silica, silica glass, and glass type 458678.

50. The projection optical system of claim 43, wherein one of the first and second negative meniscus elements is formed from a glass types selected from the group of glass types comprising: 548458, 532490, 581408 and 567428.

51. The projection optical system of claim 43, further including:
a numerical aperture of between 0.16 and 0.18, inclusive; and
one of a square exposure field size of at least 61.5 mm×61.5 mm and a rectangular exposure field having a size of at least 50 mm×100 mm.

52. The projection optical system of claim 43, further including an exposure field having a field radius that is equal to about 0.067 times a radius of the mirror.

53. A projection lithography system comprising:
a projection optical system according to claim 1;
a mask stage capable of supporting a mask at the object plane;
an illuminator adapted to illuminate the mask with at least one of the g-line, h-line, and i-line wavelengths; and
a wafer stage capable of movably supporting at wafer at the image plane.

54. The projection optical system of claim 53, further including:
a numerical aperture of between 0.16 and 0.18, inclusive; and
one of a square exposure field size of at least 61.5 mm×61.5 mm and a rectangular exposure field having a size of at least 50 mm×100 mm.

55. The projection optical system of claim 53, further including an exposure field having a field radius that is equal to about 0.067 times a radius of the mirror.

56. A projection lithography system comprising:
a projection optical system according to claim 17
a mask stage capable of supporting a mask at the object plane;
an illuminator adapted to illuminate the mask with at least one of the g-line, h-line, and i-line wavelengths; and
a wafer stage capable of movably supporting at wafer at the image plane.

57. The projection optical system of claim 56, further including:
a numerical aperture of between 0.16 and 0.18, inclusive; and
one of a square exposure field size of at least 61.5 mm×61.5 mm and a rectangular exposure field having a size of at least 50 mm×100 mm.

58. The projection optical system of claim 56, further including an exposure field having a field radius that is equal to about 0.067 times a radius of the mirror.

59. A projection lithography system comprising:
a projection optical system according to claim 26
a mask stage capable of supporting a mask at the object plane;
an illuminator adapted to illuminate the mask with at least one of the g-line, h-line, and i-line wavelengths; and
a wafer stage capable of movably supporting at wafer at the image plane.

60. The projection optical system of claim 59, further including:
a numerical aperture of between 0.16 and 0.18, inclusive; and
one of a square exposure field size of at least 61.5 mm×61.5 mm and a rectangular exposure field having a size of at least 50 mm×100 mm.

61. The projection optical system of claim 59, further including an exposure field having a field radius that is equal to about 0.067 times a radius of the mirror.

62. A projection lithography system comprising:
a projection optical system according to claim 34
a mask stage capable of supporting a mask at the object plane;
an illuminator adapted to illuminate the mask with at least one of the g-line, h-line, and i-line wavelengths; and
a wafer stage capable of movably supporting at wafer at the image plane.

63. The projection optical system of claim 62, further including:
a numerical aperture of between 0.16 and 0.18, inclusive; and
one of a square exposure field size of at least 61.5 mm×61.5 mm and a rectangular exposure field having a size of at least 50 mm×100 mm.

64. The projection optical system of claim 62, further including an exposure field having a field radius that is equal to about 0.067 times a radius of the mirror.

65. A projection lithography system comprising:
a projection optical system according to claim 43
a mask stage capable of supporting a mask at the object plane;
an illuminator adapted to illuminate the mask with at least one of the g-line, h-line, and i-line wavelengths; and
a wafer stage capable of movably supporting at wafer at the image plane.

66. The projection optical system of claim 65, further including:
a numerical aperture of between 0.16 and 0.18, inclusive; and
one of a square exposure field size of at least 61.5 mm×61.5 mm and a rectangular exposure field having a size of at least 50 mm×100 mm.

67. The projection optical system of claim 65, further including an exposure field having a field radius that is equal to about 0.067 times a radius of the mirror.

\* \* \* \* \*